United States Patent [19]

Koga et al.

[11] Patent Number: 5,421,956
[45] Date of Patent: Jun. 6, 1995

[54] METHOD OF FABRICATING AN INTEGRATED PRESSURE SENSOR

[75] Inventors: Kazuhiko Koga, Toyohashi; Michitaka Hayashi, Nogaya; Kazuhisa Ikeda, Chiryu, all of Japan

[73] Assignee: Nippondenso Co., Ltd., Kariya, Japan

[21] Appl. No.: 72,758

[22] Filed: Jun. 7, 1993

Related U.S. Application Data

[63] Continuation-in-part of Ser. No. 978,514, Nov. 20, 1992, abandoned.

[30] Foreign Application Priority Data

Nov. 20, 1991 [JP] Japan .................. 3-304962
Nov. 20, 1991 [JP] Japan .................. 3-304963
Jun. 9, 1992 [JP] Japan .................. 4-149669
Jun. 9, 1992 [JP] Japan .................. 4-149670
Jul. 2, 1992 [JP] Japan .................. 4-175779
Sep. 25, 1992 [JP] Japan .................. 4-256925

[51] Int. Cl.$^6$ .......................... H01L 21/306
[52] U.S. Cl. .......................... 216/2; 437/7; 437/226; 148/DIG. 28
[58] Field of Search .............. 156/645; 437/7, 226; 148/DIG. 28; 338/4, 42

[56] References Cited

U.S. PATENT DOCUMENTS 4,675,643 6/1987 Tanner et al. .
4,800,758 1/1989 Knecht et al. .................. 338/42
4,802,952 2/1989 Kobori et al. .................. 338/4
4,881,056 11/1989 Mizukoshi et al. .................. 338/42

FOREIGN PATENT DOCUMENTS 60-167385 8/1985 Japan .
62-212539 9/1987 Japan .
63-128729 6/1988 Japan .
63-36154 7/1988 Japan .
1-216550 8/1989 Japan .
1-236659 9/1989 Japan .
4-013867 3/1992 Japan .
4-013868 3/1992 Japan .
4-242978 8/1992 Japan .

Primary Examiner—Brian E. Hearn
Assistant Examiner—Kevin M. Picardat
Attorney, Agent, or Firm—Cushman, Darby & Cushman

[57] ABSTRACT

A method of fabricating an integrated pressure sensor, which is capable of decreasing adverse effects caused by the distortion occurring at the time when a silicon wafer and a seat are joined together. On a silicon wafer 1 are formed a thin diaphragm 2 for each of the chips, a piezo-resistance layer for each of the chips, and a signal processing circuit with an adjusting resistor for each of the chips. The silicon wafer 1 is joined onto a glass seat 6 that has pressure-adjusting passges 7 formed therein to adjust the pressure exerted on the diaphragms 2 of the silicon wafer 1. Half-dicing is effected that reaches a predetermined depth of the glass seat 6 penetrating through the silicon wafer 1 for each of the chips, and resistance of the adjusting resistor is adjusted for each of the chips while adjusting the pressure applied to the diaphragms 2 via pressure-adjusting passages 7 in the seat in a step of adjusting the pressure sensitivity by trimming the wafer and by applying a negative pressure. Finally, the silicon wafer 1 and the glass seat 6 are cut by full-dicing for each of the chips.

10 Claims, 28 Drawing Sheets

METHOD OF FABRICATING AN INTEGRATED PRESSURE SENSOR

CROSS REFERENCE TO RELATED APPLICATION

This application is a continuation-in-part application of Ser. No. 07/978,514 filed on Nov. 20, 1992, now abandoned.

BACKGROUND OF THE INVENTION

1. Field of the Invention

The present invention relates to a method of fabricating an integrated pressure sensor. More specifically, the invention relates to a method of fabricating an integrated pressure sensor by effecting trimming in a stage of the wafer.

2. Description of the Related Art

In conventional semiconductor pressure sensors, so far, the pressure sensitivity characteristics of the chips formed on a silicon wafer have been measured after the chips are separated into individual ones from the silicon wafer and are assembled on stems. FIG. 1 is a sectional view illustrating the structure when the pressure sensitivity characteristics of individual chips are to be measured relying upon a conventional method in a manner as described below. That is, a chip 121 separated from a silicon wafer is air-tightly joined to a glass 122 which is bored for introducing pressure and which is used for reducing thermal stress, and the glass is then air-tightly adhered to a bored stem 123 by using an adhesive agent 124. Then, gold wires or aluminum wires 126 from the chip 121 are bonded to external terminals 125 of the bored stem 123. Next, the bored stem 123 is air-tightly sealed with a cap 127 having a port. Finally, a pressure is introduced through the port 128 to measure the pressure sensitivity characteristics.

According to the above-mentioned prior art, the pressure sensitivity characteristics are measured by separating the chip 121 from the silicon wafer, assembling the chip on the bored stem 123, and applying a pressure thereto. Therefore, cumbersome operations and extended periods of time are required before measuring the pressure sensitivity characteristics after the wafer process has been finished. Moreover, chips having poor characteristics are often assembled. That is, in the prior art, the pressure sensors are adjusted for their sensitivities in the stage of chip making. It is necessary to solve the aforementioned problems.

In recent years, on the other hand, there has been a tendency to mount on a single chip a diaphragm portion which constitutes a semiconductor pressure sensor and a varieity of operation processing units accompanied, however, by the need of trimming a plurality of sensor-constituting portions on which are mounted the diaphragm portion that constitutes the sensor portion and the operation processing units at the wafer stage in order to adjust the sensitivities so that the individual sensors in the form of chips will exhibit normal output values. That is, the integrated pressure sensors have heretofore been produced by forming a diaphragm, a piezo-resistance layer and a signal processing circuit on a silicon wafer for each of the sensor chips, joining the silicon wafer onto a seat, trimming the adjusting resistor under this condition, and dicing the silicon wafer into individual chips.

With the trimming being effected as mentioned above, however, the sensor chips after dicing produce fluctuating outputs being affected by distortion in the junction between the silicon wafer and the seat. That is, the distortion built up by the junction of the silicon wafer and the seat is released by dicing, whereby the stress in the diaphragm undergoes a change resulting in a fluctuation in the output after the dicing. Or, more specifically, the distortion that is built up due to a difference in the coefficient of thermal expansion between the silicon wafer and the seat when they are joined together, is released in a step of dicing. Therefore, the output fluctuates even if the adjustment is accomplished in the wafer stage.

SUMMARY OF THE INVENTION

The object of the present invention is to provide a method of fabricating an integrated pressure sensor, which is capable of decreasing adverse effects caused by the distortion at the time when a silicon wafer and a seat are joined together.

The gist of the present invention resides in a method of fabricating an integrated pressure sensor comprising:

a first step for forming on a silicon wafer a thin diaphragm for each of the chips, a piezo-resistance layer for each of the chips, and a signal processing circuit that has an adjusting resistor for each of the chips;

a second step for joining said silicon wafer onto said seat;

a third step for effecting half-dicing that reaches a predetermined depth of said seat penetrating through said silicon wafer for each of the chips;

a fourth step for adjusting the resistance of said adjusting resistor for each of the chips; and a fifth step for effecting full-dicing to cut said silicon wafer and said seat for each of the chips.

Here, the seat in the second step may have a pressure-adjusting passage for applying a pressure to the diaphragm of the silicon wafer and in the fourth step, the resistance of the adjusting resistor may be adjusted for each of the chips by adjusting the pressure exerted on the diaphragm through the pressure-adjusting passage.

In the first step, there are formed on the silicon wafer a thin diaphragm for each of the chips, a piezo-resistance layer for each of the chips and a signal processing circuit with an adjusting resistor for each of the chips. In the second step, the silicon wafer is joined onto the seat and in the third step, half-dicing is effected that reaches a predetermined depth of the seat penetrating through the silicon wafer for each of the chips. In the fourth step, the resistance of the adjusting resistor is adjusted for each of the chips and in the fifth step, full-dicing is effected to cut the silicon wafer and the seat for each of the chips. Here, in the fourth step, the resistance of the adjusting resistor is adjusted free of distortion that built up when the silicon wafer and the seat are joined together, since grooves have already been formed by half-dicing effected in the third step. Accordingly, adjustment is not adversely affected by the distortion which builds up when the silicon wafer and the seat are joined together.

In the fourth step, furthermore, the silicon wafer will be warped since the resistance of the adjusting resistor is adjusted for each of the chips by adjusting the pressure exerted on the diaphragm through the pressure-adjusting passage. Owing to the grooves formed by half-dicing, however, the distortion caused by the warping of the silicon wafer does not reach the piezo-resistance layer and does not adversely affect the adjustment.

According to the present invention, thereafter, the silicon wafer and the seat are subjected to full-dicing for each of the chips by using a saw that has a predetermined thickness, in order to separate the silicon wafer into individual chips.

DETAILED DESCRIPTION OF THE PREFERRED EMBODIMENTS

Embodiments related to the method of fabricating an integrated pressure sensor in accordance with the present invention will now be described in detail with reference to the drawings.

First Embodiment

FIGS. 2 to 9 illustrate the steps for fabricating an integrated pressure sensor according to the present invention.

Figure 1:
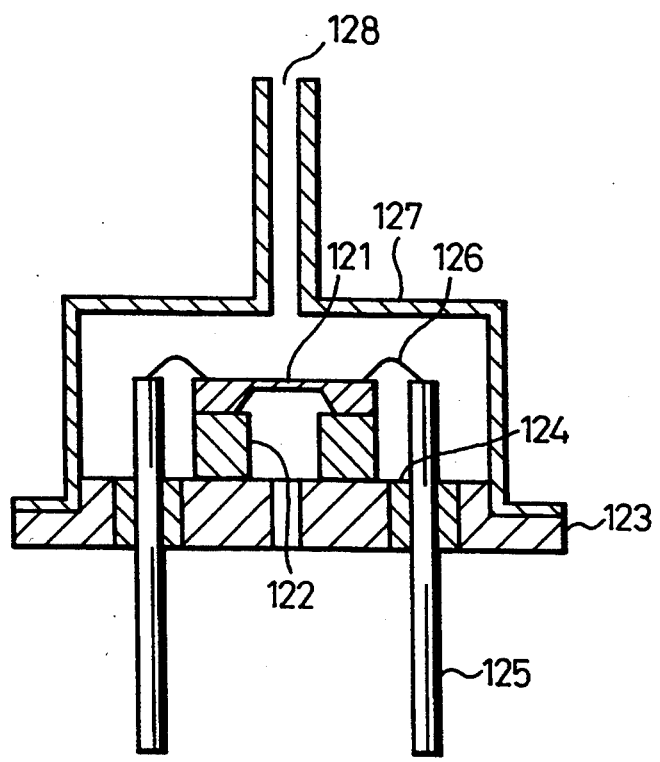
FIG. 1 is a diagram showing a conventional method of measuring the pressure sensitivity in a stage of a chip.
Figure 2:
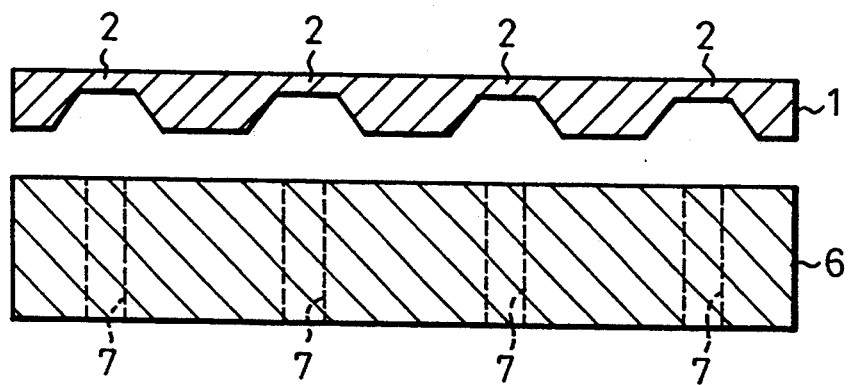
FIG. 2 is a diagram illustrating a step of fabricating an integrated pressure sensor according to a first embodiment of the present invention.
Figure 10:
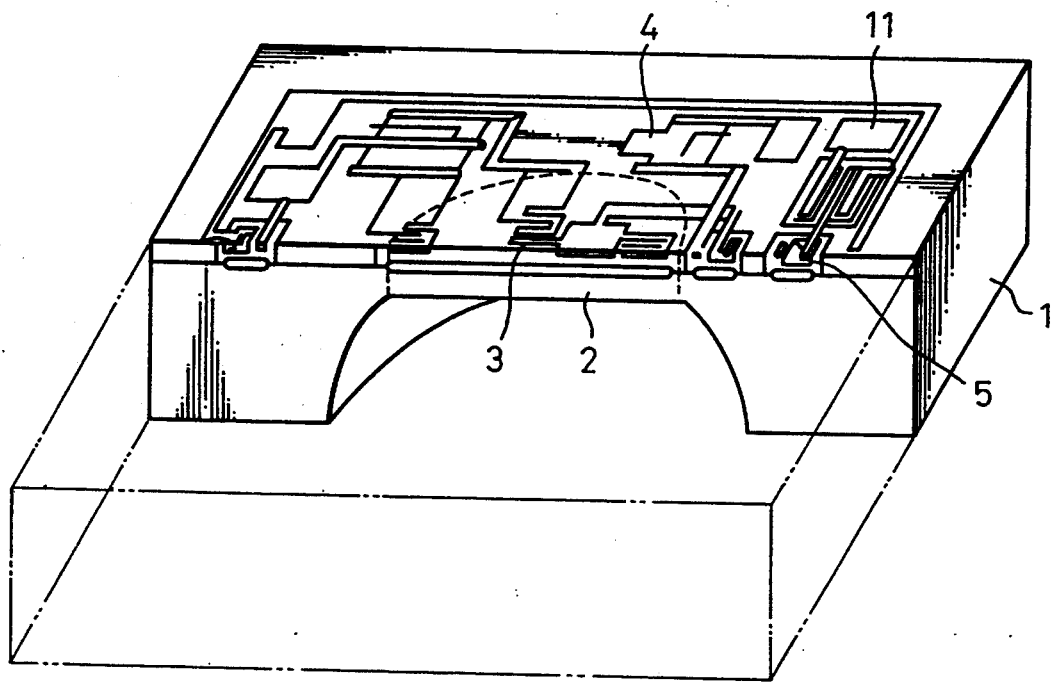
FIG. 10 is a perspective view of the integrated pressure sensor.

As shown in FIG. 2, first, a thin diaphragm 2 is formed for each of the chips in a silicon wafer 1. As shown in FIG. 10, furthermore, there are formed a piezo-resistance layer (guage resistor) 3 for each of the chips and a signal processing circuit 5 having an adjusting resistor (thin-film resistor) 4 for each of the chips. That is, in FIG. 10, the diaphragm 2 is formed by decreasing the thickness of its central portion, the piezo-resistance layer 3 is formed in the diaphragm 2 by diffusing impurities therein, and the signal processing circuit 5 having the adjusting resistor 4 is formed in an integrated manner in a thick portion other than the diaphragm 2. The signal processing circuit 5 works to amplify signals formed by the piezo-resistance layer 3.

Figure 3:
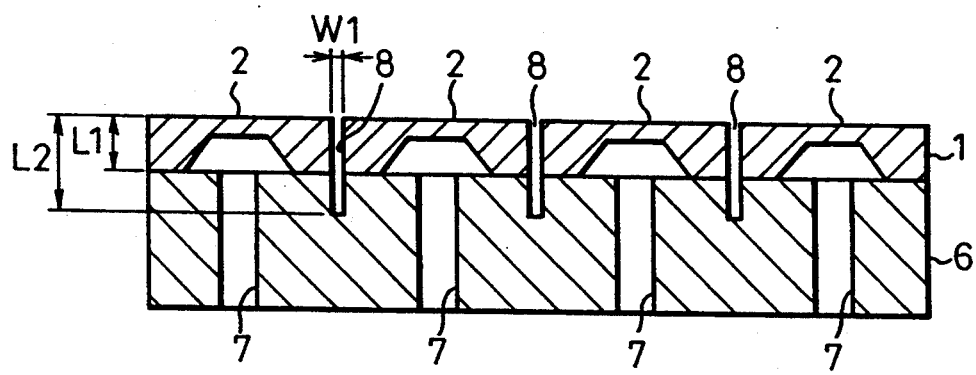
FIG. 3 is a sectional view illustrating a step of fabricating the integrated pressure sensor.

Then, a glass seat 6 of FIG. 2 is prepared. In the glass seat 6 are formed many pressure-adjusting passages 7 that correspond to the diphragms 2 of the wafer 1, the ends on one side of the passages 7 opening on the upper surface and the ends on the other side opening on the lower surface. As shown in FIG. 3, the silicon wafer 1 is anodically joined onto the glass seat 6. Then, half-dicing is effected that reaches a predetermined depth of the glass seat 6 penetrating through the silicon wafer 1 for each of the chips. Grooves 8 are formed by the half-dicing. That is, the grooves 8 are formed having a depth L2 which is greater than the thickness L1 of the silicon wafer 1, the grooves 8 having a width W1 (which in this embodiment is 150 μm).

Figure 11:
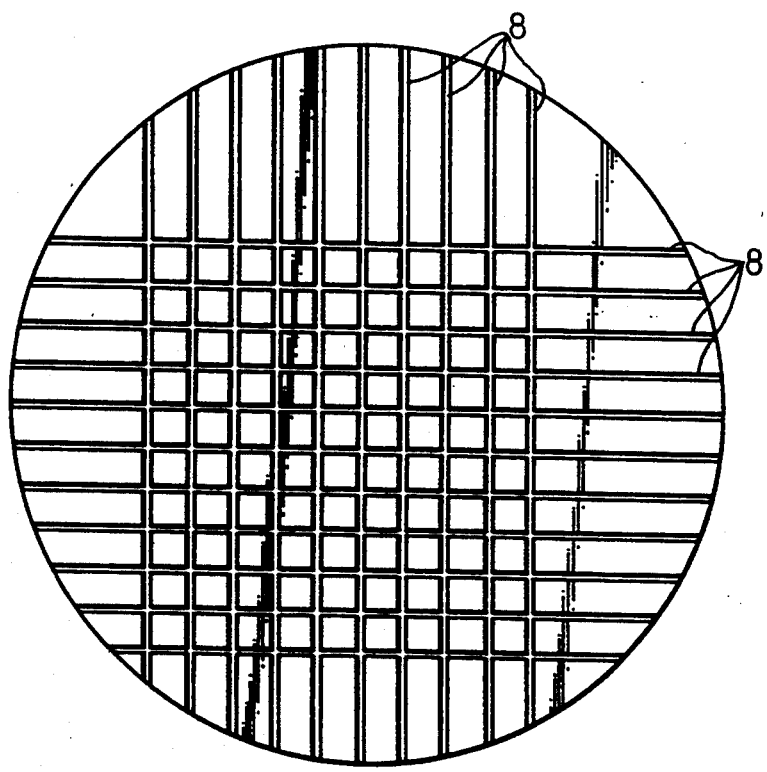
FIG. 11 is a plan view of a silicon wafer.

FIG. 11 is a plan view of the silicon wafer 1 after it is half-diced. The grooves 8 are formed in the silicon wafer 1 along the boundaries of the neighboring chips.

Figure 4:
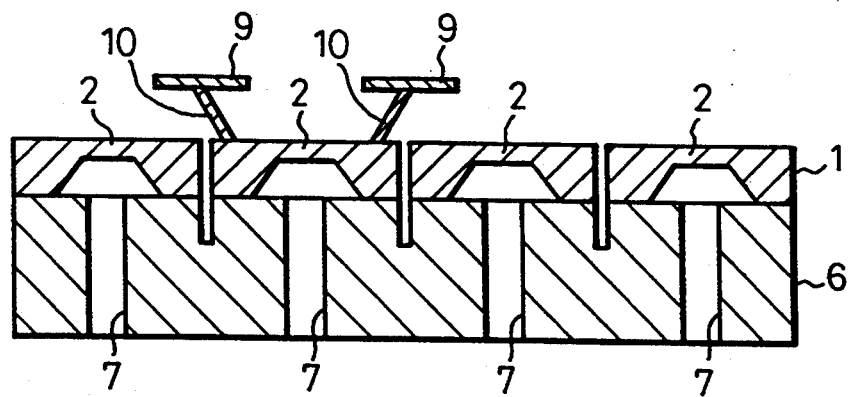
FIG. 4 is a sectional view illustrating a step of fabricating the integrated pressure sensor.

Referring to FIG. 4, a first detection of circuit characteristics is carried out for each of the chips. That is, the circuit characteristics are inspected by bringing a prober 10 fixed to a probe card 9 into contact with a probing pad 11 (see FIG. 10).

Figure 5:
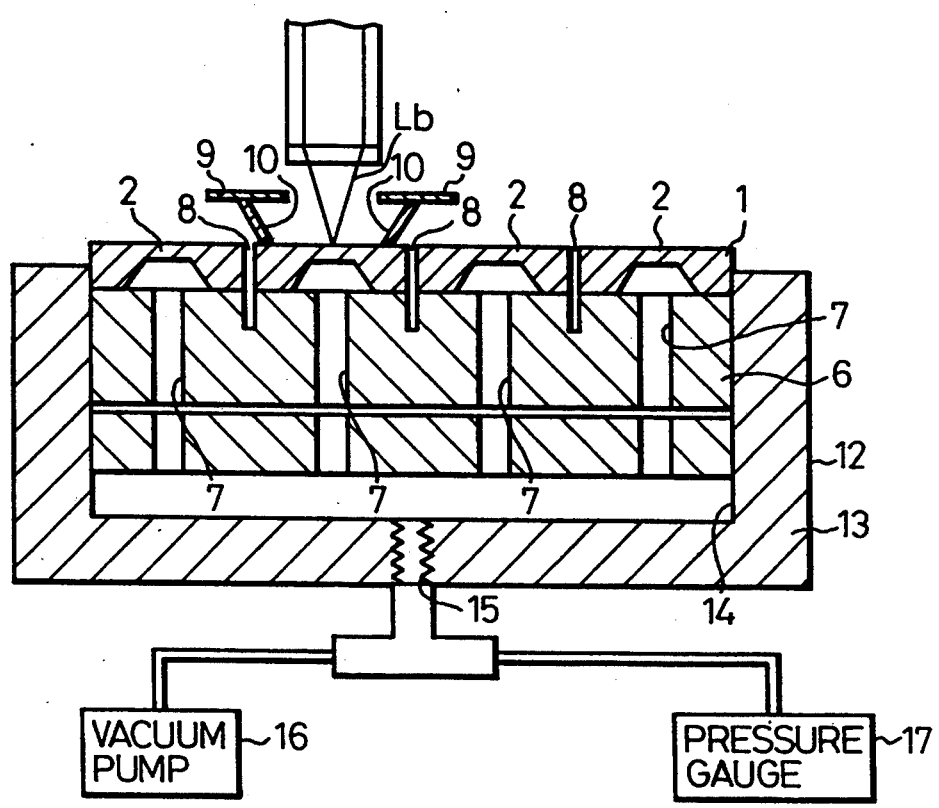
FIG. 5 is a sectional view illustrating a step of fabricating the integrated pressure sensor.

Then as shown in FIG. 5, the silicon wafer 1 and the glass seat 6 are set onto a pressure-setting stage 12 which has a recessed portion 14 formed in a stage body 13 thereof, and a pressure-adjusting passage 15 is formed in the bottom of the recessed portion 14. A vacuum pump 16 and a pressure gauge 17 are connected to the passage 15. The silicon wafer 1 and the glass seat 6 are inserted in the recessed portion 14 of the stage body 13. In this condition, the pressure sensitivity is adjusted for each of the chips. That is, the resistance is adjusted by the adjusting resistor 4 being irradiated with a laser beam Lb while keeping the prober 10 in contact with the probing pad 11. The adjustment is carried out by using the vacuum pump 16 and the pressure gauge 17, and by applying atmospheric pressure (760 mmHg) and a negative pressure (2 mmHg) to the diaphragm 2.

The silicon wafer 1 is subject to being warped in the step of pressure sensitivity adjustment by trimming the wafers where a negative pressure is applied. However, the stress due to the warping of silicon wafer 1 is transmitted in reduced amounts to the piezo-resistance layer (guage resistance) 3 owing to the groove 8 formed by half-dicing.

Figure 6:
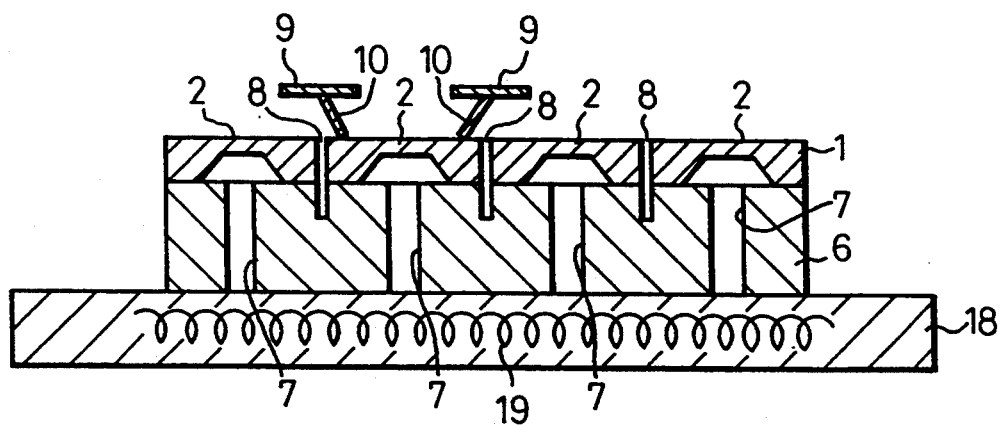
FIG. 6 is a sectional view illustrating a step of fabricating the integrated pressure sensor.

Then, as shown in FIG. 6, the silicon wafer 1 and the glass seat 6 are set onto a temperature-setting stage 18 which is equipped with a heater 19. By flowing a current to the heater 19, the silicon wafer 1 can be heated to any temperature. In this condition, a high temperature compensation quantity is measured for each of the chips. That is, output values are measures at an ordinary temperature and at a high temperature (100° C.) while keeping the prober 10 in contact with the probing pad 11, thereby to measure the high temperature compensation quantity.

Figure 7:
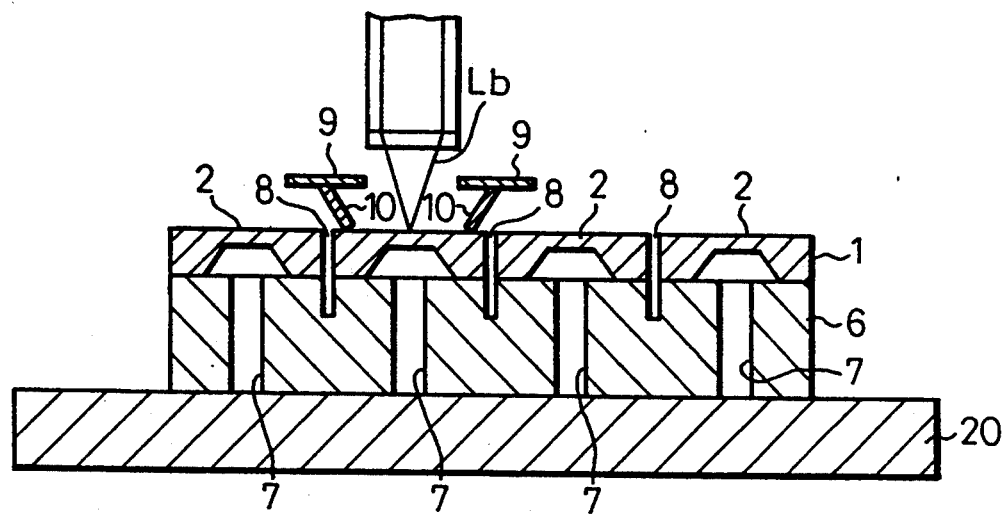
FIG. 7 is a sectional view illustrating a step of fabricating the integrated pressure sensor.

Then, as shown in FIG. 7, the silicon wafer 1 and the glass plate 6 are set onto a stage 20 in order to adjust the high temperature compensation for each of the chips. That is, the resistance is adjusted by irradiating the adjusting resistor 4 with the laser beam Lb while keeping the prober 10 in contact with the probing pad 11, to thereby eliminate the drift caused by temperature. In this condition, furthermore, the output is adjusted for each of the chips with no pressure being exerted on the diaphragm 2, i.e., offset adjustment is carried out. That is, according to the present invention, adjusting the resistance by trimming the resistor is equivalent to adjusting the pressure sensitivity of the pressure sensor or adjusting the offset.

Figure 8:
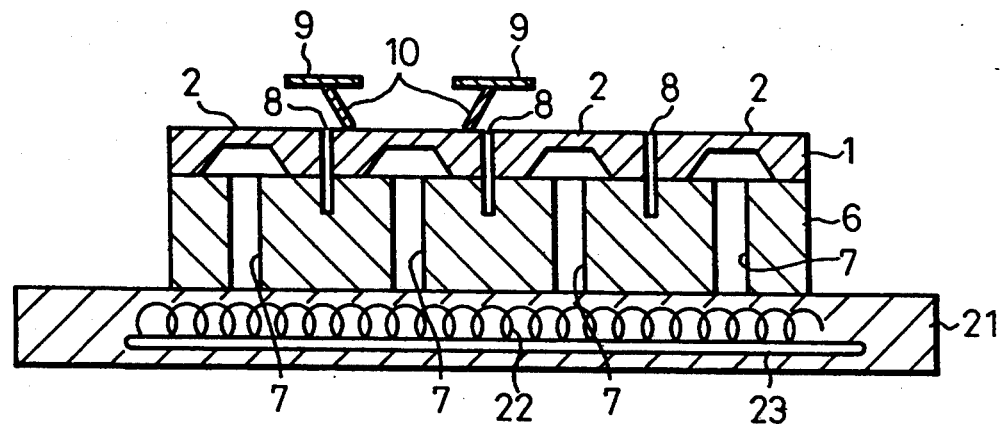
FIG. 8 is a sectional view illustrating a step of fabricating the integrated pressure sensor.

As shown in FIG. 8, furthermore, the silicon wafer 1 and the glass seat 6 are set onto a temperature-setting stage 21 which is equipped with a heater 22 and a cooling pipe 23 through which liquid nitrogen passes. The silicon wafer 1 can be heated to a high temperature by flowing a current to the heater 22 and can be cooled to a low temperature by supplying liquid nitrogen into the cooling pipe 23. The circuit characteristics are then checked a second time for each of the chips. That is, characteristics of the circuit are inspected at a high temperature, at a normal temperature and at a low temperature while keeping the prober 10 fitted to the probe card 9 in contact with the probing pad 11.

Figure 9:
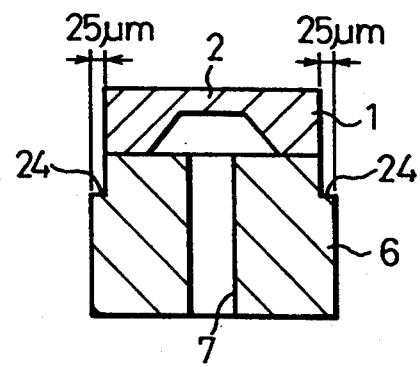
FIG. 9 is a sectional view illustrating a step of fabricating the integrated pressure sensor.

Then, as shown in FIG. 9, the silicone wafer 1 and the glass seat 5 are cut by full-dicing for each of the chips.

In this case, the groove formed by the passage of the dicing saw has a width of 100 μm. Therefore, a 25 μm stepped portion 24 is formed on a side surface of the chip that is cut. In this case, if the groove formed by full-dicing has a width the same as the width of the groove formed by half-dicing and if the position of the dicing saw is deviated, or if the groove formed by full-dicing has a width which is greater than the width of the groove formed by half-dicing, then the dicing saw is bent and is twisted at the time of effecting the full-dicing along the groove formed by half-dicing. In the worst case, the dicing saw is broken. According to this embodiment, therefore, the groove formed by half-dicing has a width (150 μm) which is greater than the width (100 μm) of the groove formed by full-dicing, so that the dicing saw will not be broken. That is, in carrying out the dicing according to the present invention, it is desired that the blade used for the full-dicing has a thickness which is smaller that the thickness of the blade used for the half-dicing.

The integrated pressure sensor is thus fabricated.

Figure 12:
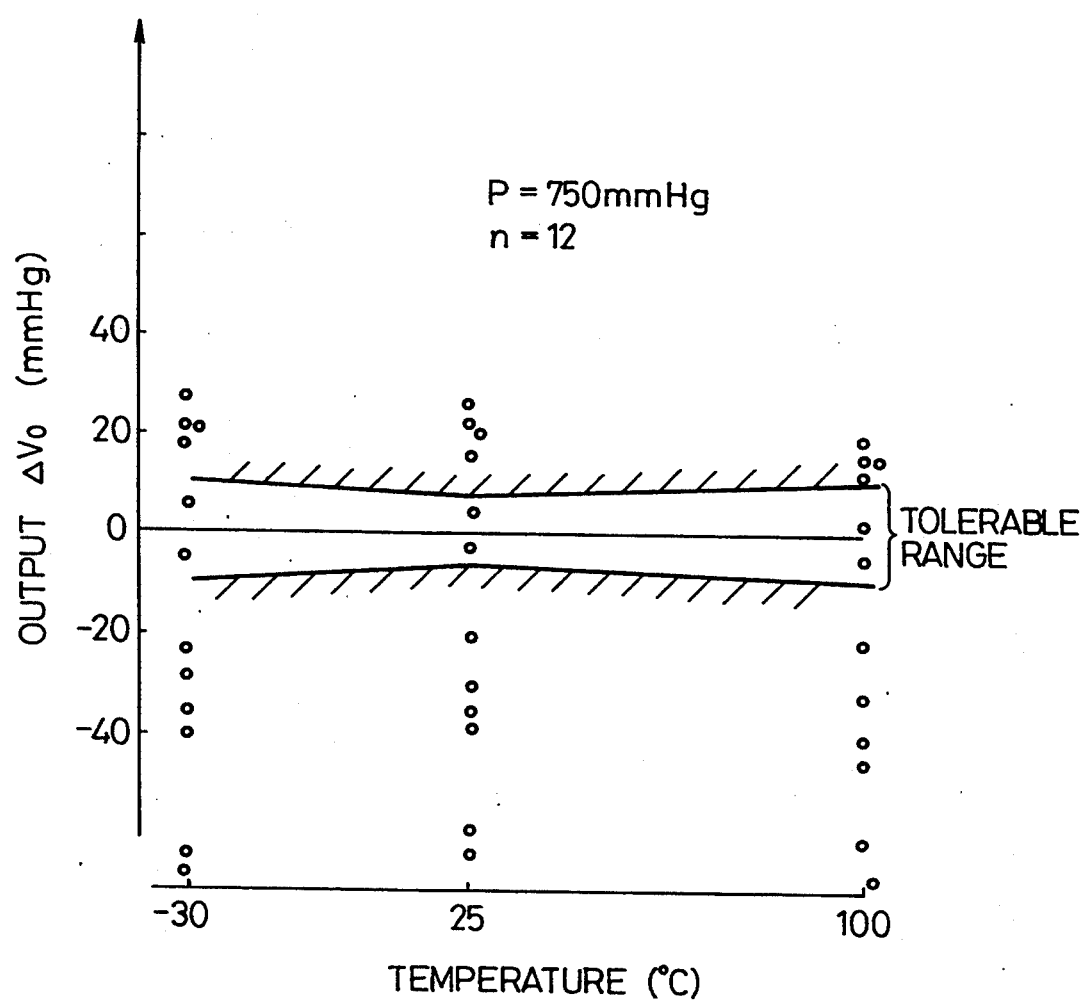
FIG. 12 is a diagram showing output characteristics of the sensor.
Figure 13:
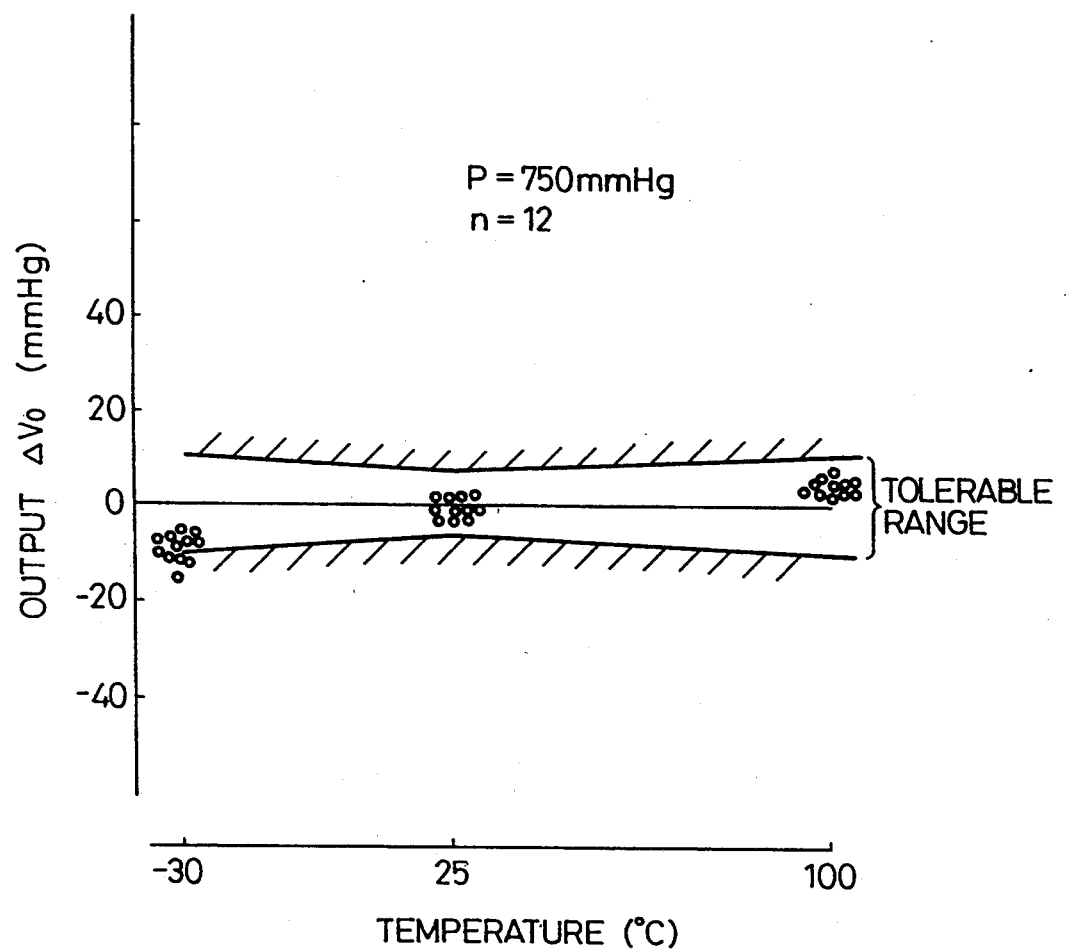
FIG. 13 is a diagram showing output characteristics of the sensor.

FIG. 12 shows output characteristics of a sensor when the half-dicing is not effected (grooves 8 are not formed) prior to adjusting the pressure sensitivity, and FIG. 13 shows output characteristics of a sensor when the half-dicing is effected prior to adjusting the pressure sensitivity. As is obvious from these drawings, the outputs vary greatly when the half-dicing is not effected and a practicable sensor is not obtained. When the half-dicing is effected, however, the outputs can be confined within a tolerable range.

Figure 14:
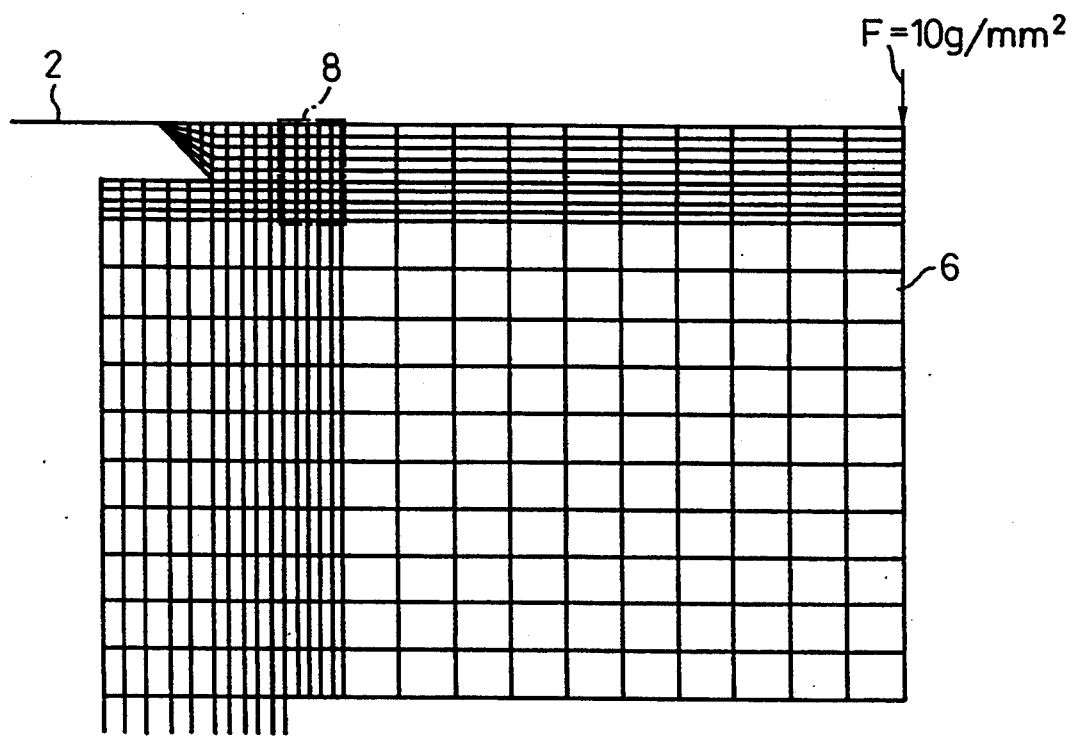
FIG. 14 is a model diagram FEM analysis.
Figure 15:
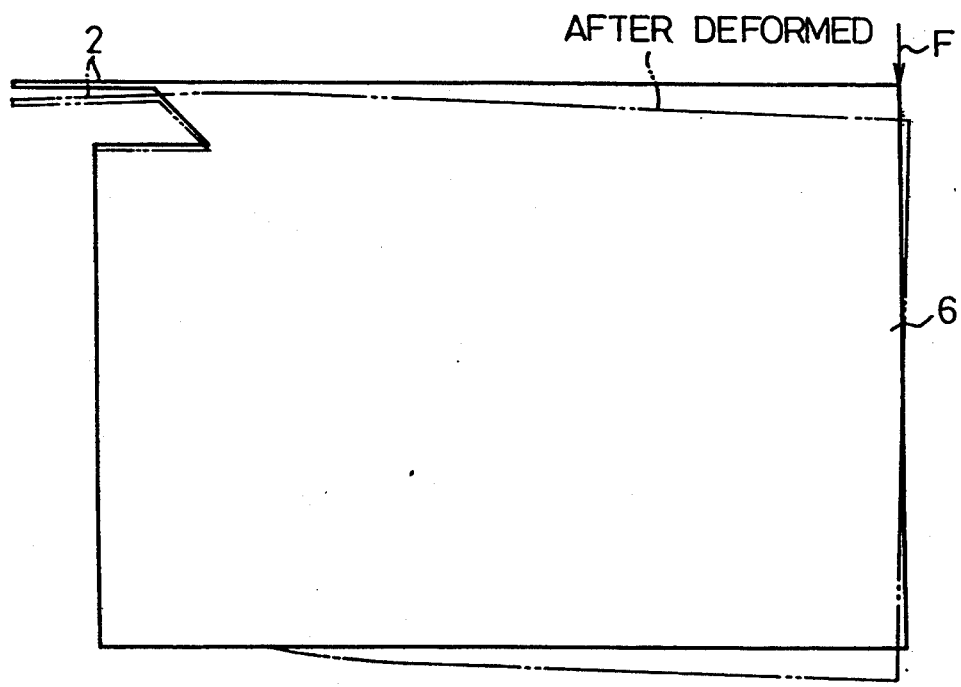
FIG. 15 is a diagram of deformation revealed by FEM analysis.

The FEM analysis is carried out according to a model shown in FIG. 14. When the silicon wafer is warped by 30 μm under the condition where the half-dicing is not effected prior to adjusting the pressure sensitivity, the stress built up in the piezo-resistance layer 3 (gauge portion) due to the warping can be calculated to be 4.92 g/mm$^2$. When the half-dicing is effected (when the grooves 8 are formed to a depth of 500 μm), however, the stress built up in the piezo-resistance layer 3 (gauge portion) is 0.83 g/mm$^2$ which is a reduction to about one-sixth. FIG. 15 is a diagram of deformation for when the half-dicing is not effected.

According to this embodiment as described above, on the silicon wafer 1 are formed a thin diaphragm for each of the chips, a piezo-resistance layer 3 for each of the chips, and a signal processing circuit 5 having an adjusting resistor 4 for each of the chips (first step). Then, the silicon wafer 1 is joined onto the glass seat 6 that has a pressure-adjusting passage 7 formed therein through which a pressure is exerted on the diaphragm 2 of the silicon wafer 1 (second step), the half-dicing is affected that reaches a predetermined depth of the glass seat 6 penetrating through the silicon wafer 1 for each of the chips (third step), the resistance of the adjusting resistor 4 is adjusted for each of the chips by adjusting the pressure exerted on the diaphragm 2 through the pressure-adjusting passage 7 formed in the seat at the item of 5 setting a negative pressure in the step of adjusting the pressure sensitivity by trimming the wafers (fourth step), and the full-dicing is effected to cut the silicon wafer 1 and the glass seat 6 for each of the chips (fifth step).

Therefore, the grooves 8 that are formed by half-dicing help release the distortion that is built up when the silicon wafer 1 and the glass seat 6 are joined together in the step of adjusting the pressure sensitivity and in the step of adjusting the offset. After the full-dicing, therefore, the pressure sensor is not adversely affected by distortion that builds up during formation of the junction. In adjusting the output in the stage of wafer, furthermore, distortion builds up due to the warping of the silicon wafer 1 that results from the application of a negative pressure. However, the grooves 8 formed by half-dicing prevent the distortion caused by warping from being transmitted to the piezo-resistance layer 3, and the pressure sensor is not adversely affected.

Second Embodiments

Next, a second embodiment will be described with reference to chiefly those points which are different from the first embodiment.

Figure 16:
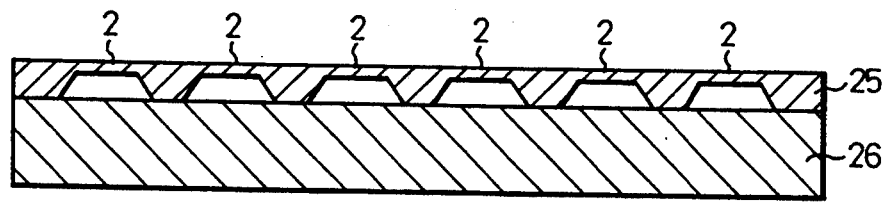
FIG. 16 is a sectional view illustrating a step of fabricating an integrated pressure sensor according to a second embodiment of the present invention.

Referring to FIG. 16, a silicon wafer 25 is reduced in thickness at its central portions as shown in FIG. 10 to form diaphragms 2. The piezo-resistance layer 3 is formed in the diaphragm 2 by diffusing impurities therein. Further, the signal processing circuit 5 having adjusting resistor 4 is formed in an integrated form in a thick portion other than the diaphragm 2. The pressure sensitivity is previously adjusted for each of the chips in the silicon wafer 25.

The silicon wafer 25 is anodically joined onto the glass seat 26 in vacuum.

Figure 17:
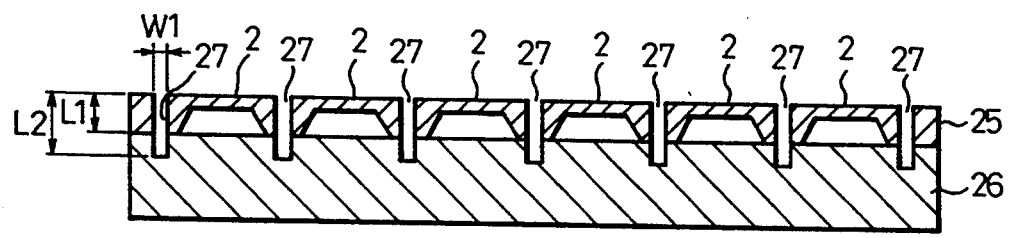
FIG. 17 is a sectional view illustrating a step of fabricating an integrated pressure sensor.
Figure 18:
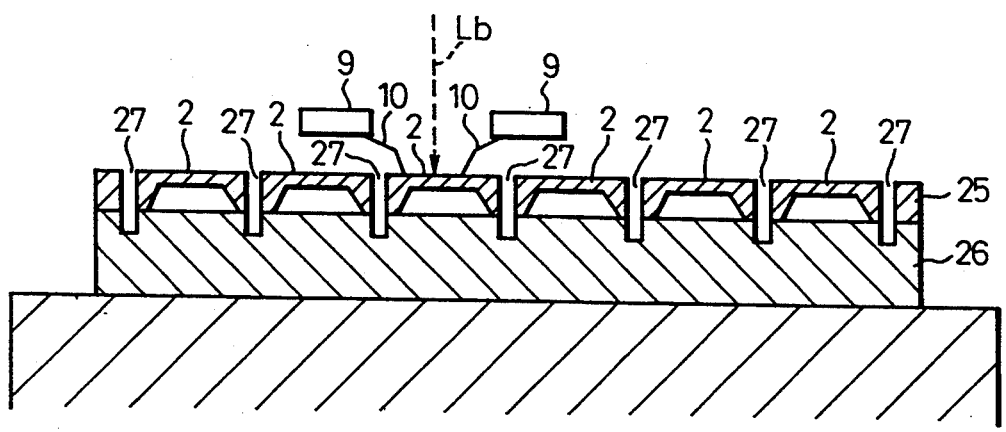
FIG. 18 is a sectional view illustrating a step of fabricating the integrated pressure sensor.

Then, as shown in FIG. 17, grooves 27 are formed by effecting half-dicing that has a predetermined depth reaching the glass seat 26 penetrating through the silicon wafer 25 for each of the chips. As shown in FIG. 18, furthermore, the resistance of the adjusting resistor is adjusted for each of the chips by using a laser beam Lb while keeping the prober 10 fitted to the probe card 9 in contact with the probing pad 11 (shown in FIG. 10). That is, offset adjustment is accomplished under the condition of atmospheric pressure based on a vacuum.

Figure 19:
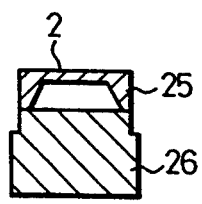
FIG. 19 is a sectional view illustrating a step of fabricating the integrated pressure sensor.

Referring next to FIG. 19, the silicon wafer 25 and the glass seat 26 are cut by dicing each of the chips.

Here, when the silicon wafer 25 and the glass seat 26 are joined together, distortion buildss up due to a difference in the coefficient of thermal expansion between them. By effecting the half-dicing to a depth greater than the thickness of the silicon wafer 25 prior to the adjustment, however, it is allowed to remove distortion in advance and to reduce the fluctuation in the output in the step of effecting the dicing for each of the chips after the adjustment has been accomplished.

Figure 20:
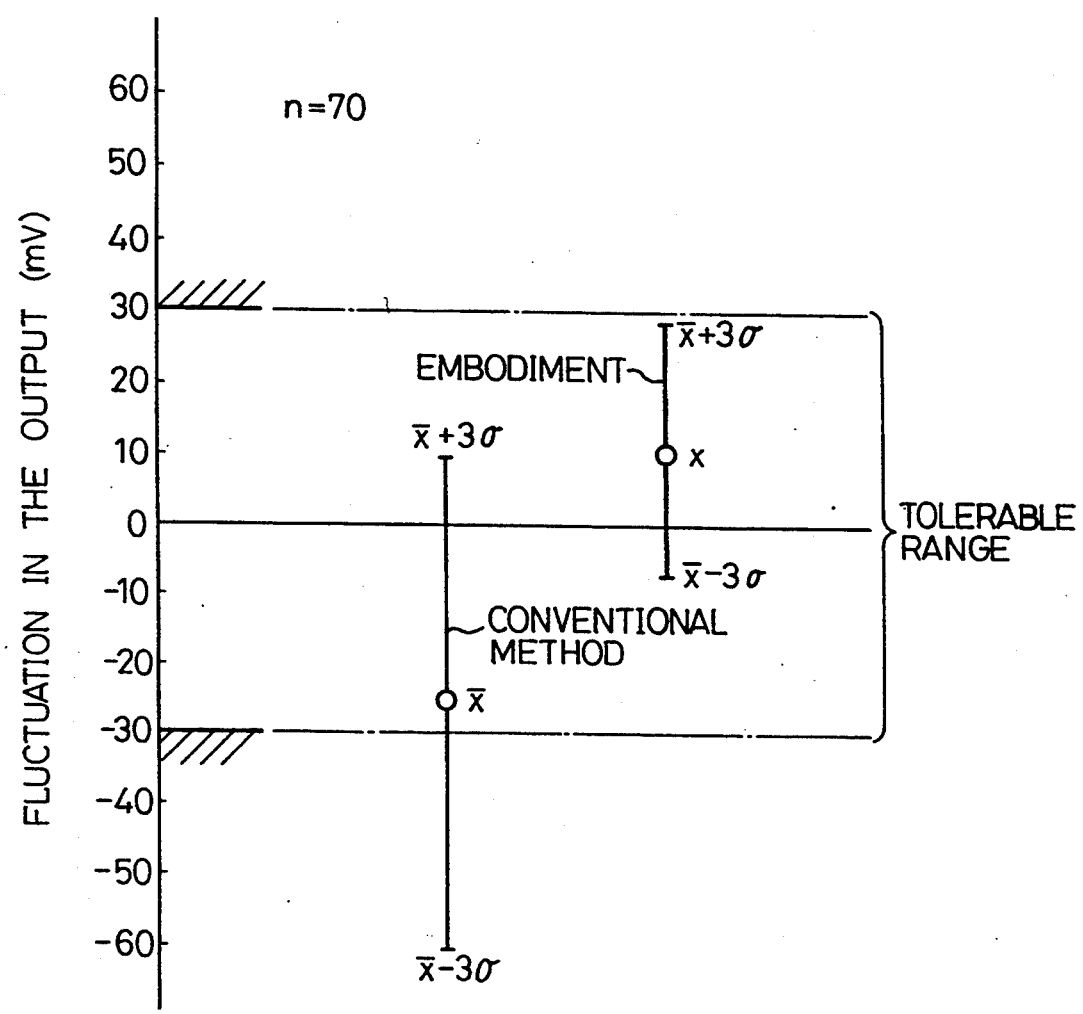
FIG. 20 is a diagram showing a change in the output of the sensor.

FIG. 20 shows a fluctuation in the output of the sensor of this embodiment that is half-diced in comparison with that of the sensor produced by the conventional method without effecting the half-dicing. It is obvious from FIG. 20, that the fluctuation in the output of the sensor obtained by the conventional method is in excess of a tolerable range of ±30 mV but the fluctuation in the case of the sensor of this embodiment is within the tolerable range.

As described above in detail, the present invention exhibits an excellent advantage of reducing adverse effects that stem from the distortion occuring when the silicon wafer and the seat are joined together.

Third Embodiments

Described below are preferred examples of the adjusting devices that are used for executing a variety of operations such as adjusting the pressure output sensitivity of the sensors, adjusting the compensation values at high temperatures and low temperatures, and adjusting the offset in the aforementioned steps of fabricating the integrated pressure sensors.

The output adjustment (trimming) has heretofore been carried out by applying a predetermined pressure to the integrated pressure sensor which is still in the form of a wafer as disclosed in Japanese Unexamined Patent Publication No. 63-128729. In order to measure the pressure sensitivity characteristics, at this moment, a porous sintered metal is used as a stage for setting a pressure. In practice, however, it is difficult to set the pressure very precisely since the pressure necessarily leaks at the interface between the wafer and the stage.

Figure 21:
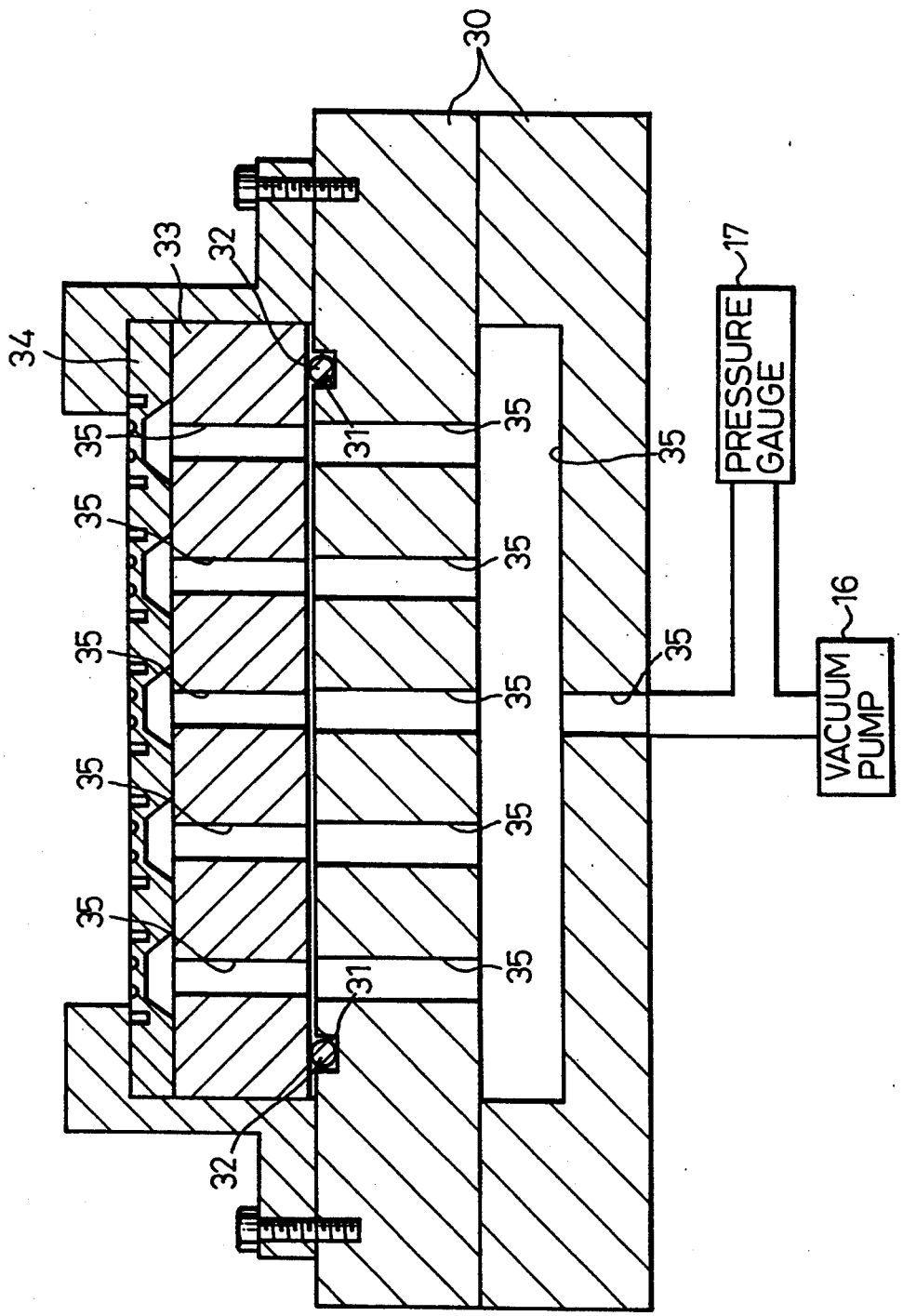
FIG. 21 is a sectional view of a pressure-adjusting device for the integrated pressure sensor for illustrating a prototype.

According to the prior work or prototype as shown in FIG. 21, therefore, a groove 31 is formed in the upper surface of the pressure-setting stage 30, an O-ring 32 is inserted in the groove 31, and a glass seat 33 to which a silicon wafer 34 is joined is depressed from the upper direction in order to maintain air-tightness in a negative-pressure space 35.

Figure 22:
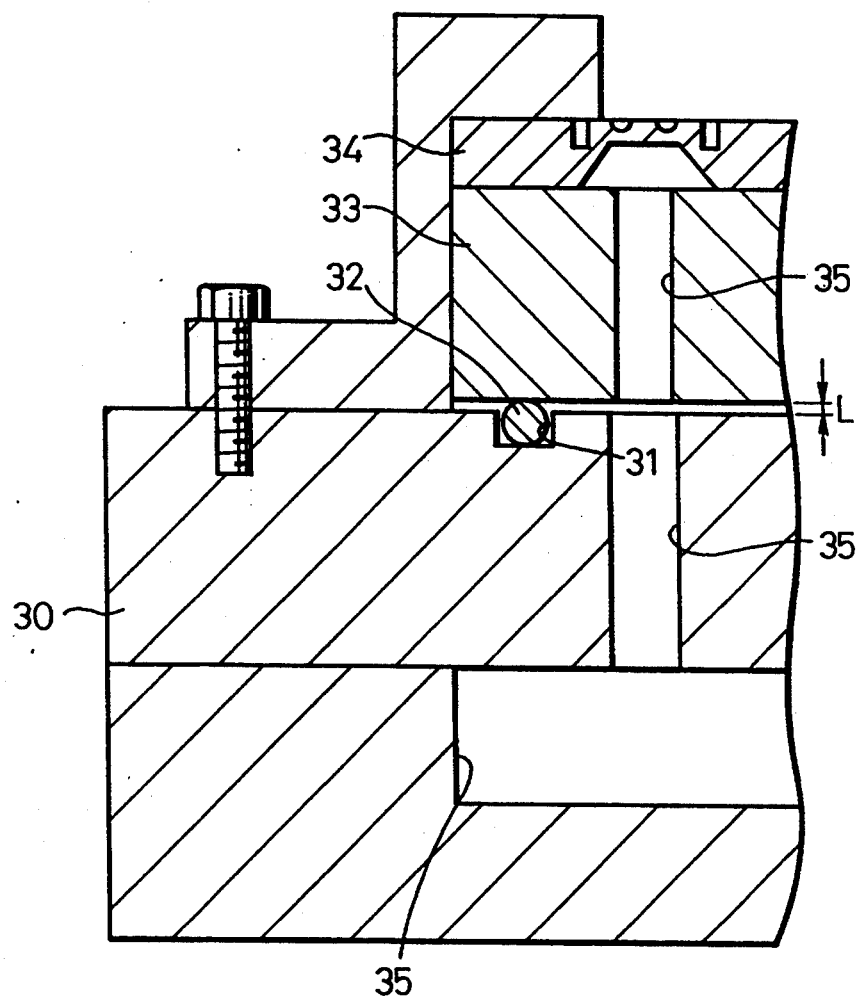
FIG. 22 is a sectional view of the pressure-adjusting device for the integrated pressure sensor for illustrating the prototype.

As shown in FIG. 22, however, the O-ring 32 cannot be depressed by being uniformly held (maintaining a constant gap L) around the outer circumference of the glass seat 33. Therefore, the silicon wafer 34 is tilted, and error develops when measurement is taken by probing.

According to a third embodiment of the present invention, therefore, use is made of a pressure-adjusting device for an integrated pressure sensor, that is capable of maintaining a sealing property when the pressure is set and of decreasing errors in the output adjustment caused by the tilting of the silicon wafer when the adjustment is being carried out.

Figure 23:
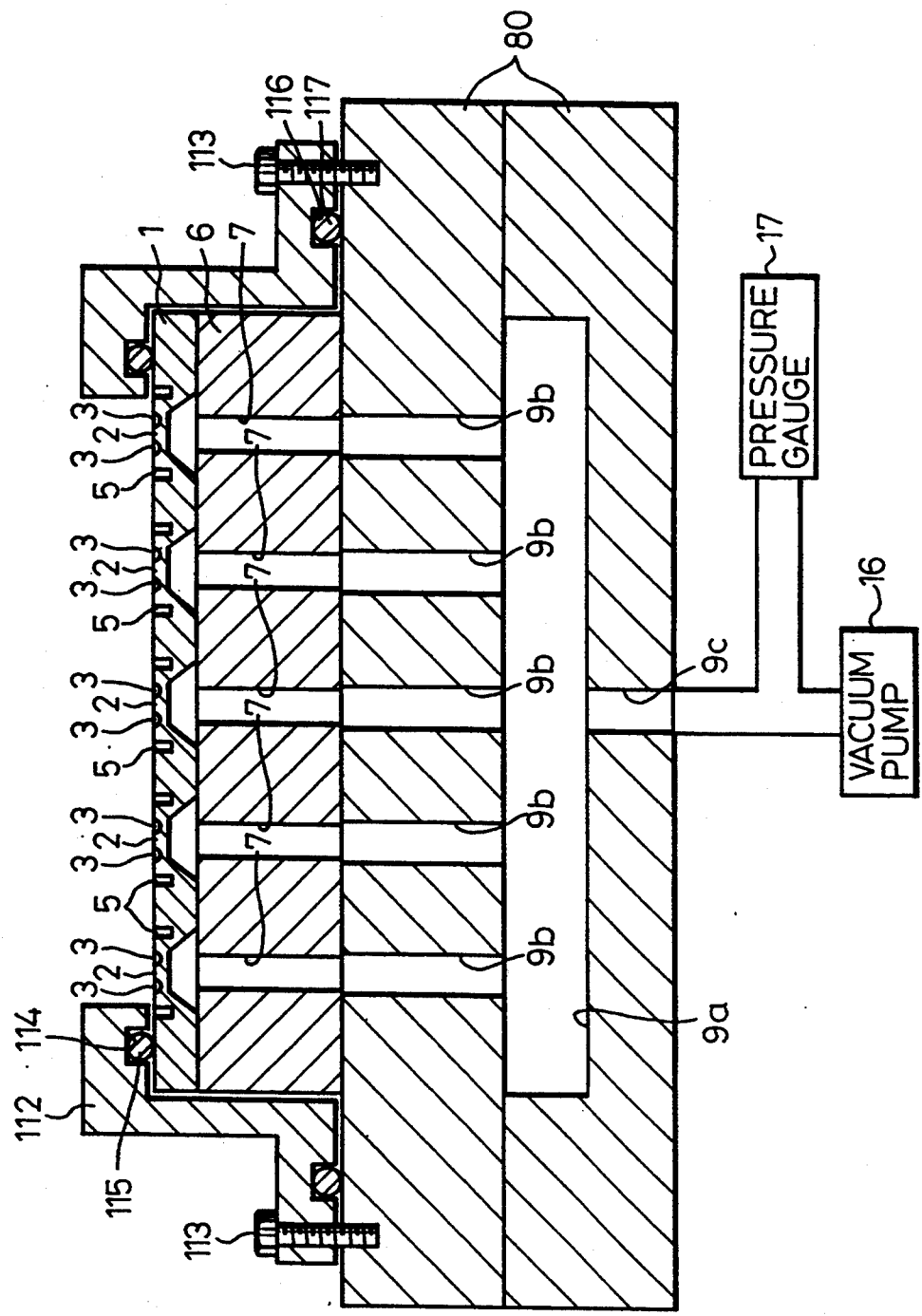
FIG. 23 is a sectional view of the pressure-adjusting device for the integrated pressure sensor according to a third embodiment of the present invention.

According to the third embodiment as shown in FIG. 23, there is provided a device for adjusting the output of an integrated pressure sensor in which a silicon wafer 1 is joined onto a seat 6 that has pressure-adjusting passages 7 formed therein, and which has formed in the silicon wafer 1 a signal processing circuit 5 with an adjusting resistor for each of the chips, a thin diaphragm for each of the chips and a piezo-resistance layer 3 for each of the chips, the device for adjusting the output of the integrated pressure sensor comprising a pressure-setting stage 8 on which the seat 6 is placed and which as pressure-adjusting passages 9a to 9c formed therein to adjust the pressure exerted on the diaphragms 3 via the pressure-adjusting passages 7 formed in the seat, a holding member 112 which is so arranged on said pressure-setting stage 8 as to surround at least the outer periphery of the seat, a first elastic air-tight member 117 constituted by an O-ring which is so arranged on the pressure-setting stage 8 as to surround the outer periphery of the seat 6 and is held being compressed by the pressure-setting stage 8 and by the holding member 112, and a second elastic air-tight member 115 constituted by an O-ring whic is so arranged as to surround the outer periphery on the upper surface of the silicon wafer 1 or to surround the outer periphery of at least either the seat 6 or the silicon wafer 1 and is held compressed by the seat 6 or by the silicon wafer 1 and the holding member 112.

Employment of the above constitution makes it possible to maintain air-tightness between the pressure-setting stage 8 and the holding member 112 along the outer periphery of the seat 6 on the pressure-setting stage 8 relying upon the first elastic air-tight member 117. Moreover, the second elastic air-tight member 115 makes it possible to maintain air-tightness between the holding member 112 and the seat 6 or the silicon wafer 1. As described above, there is no elastic air-tight member (O-ring) between the seat 6 and the pressure-setting stage 8, and the silicon wafer is prevented in advance from being tilted.

The above third embodiment will now be described in conjunction with the drawings.

FIG. 23 illustrates the whole constitution of the pressure-adjusting device for integrated pressure sensors. In the silicon wafer 1 are formed a thin diaphragm 2 for each of the chips, as well as a piezo-resistance layer (gauge resistor) 3 for each of the chips and a signal processing circuit 5 having an adjusting resistor (thin-film resistor) 4 for each of the chips as shown in FIG. 10. That is, as shown in FIG. 10, the thickness of the central portion is decreased to constitute the diaphragm 2, the piezo-resistance layer 3 is formed in the diaphragm 2 by diffusing impurities therein, and a signal processing circuit 5 having an adjusting resistor 4 is formed in an integrated form on a thick portion other than the diaphragm 2. The signal processing circuit 5 works to amplify the signals produced by the piezo-resistance layer 3.

In FIG. 3, the glass seat 6 has a number of pressure-adjusting passages 7 formed therein to correspond to the diaphragms 2 formed in the silicon wafer 1, the ends on one side of the passages 7 being open on the upper surface thereof and the ends on the other side thereof being open on the lower surface. As shown in FIG. 23, the silicon wafer 1 is anodically joined onto the glass seat 6.

The groove 8 are preferably provided on the wafer to release the strain, although FIG. 23 does not disclose it.

The pressure-setting stage 80 has pressure-adjusting passages 9a, 9b and 9c formed therein, the end on one side of the pressure-adjusting passage 9c being open on the lower surface, the end on the other side thereof being communicated with the pressure-adjusting passages 9a which is branched into many passages 9b. The ends on the other side of the pressure-adjusting passages 9b are open in the upper surface of the glass seat 6 so as to be opposed to the openings on one side of the pressure-adjusting passages 7 formed in the seat. The pressure-adjusting passages 9c in the stage is connected to a vacuum pump 16 and to a pressure gauge 17. On the pressure-setting stage 80 is placed a glass seat 6 to which the silicon wafer 1 is joined.

The holding member 112 is secured to the upper surface of the pressure-setting stage 80 by screws 113. The holding member 112 has a shape that covers the outer peripheries of the glass seat 6 and of the silicon wafer 1 and further covers the upper periphery of the silicon wafer 1.

An annular recessed portion 114 is formed in a portion of the holding member 112 that faces the upper surface of the silicon wafer 1, and the O-ring 115 is fitted in the recessed portion 114 and is compressed by the holding member 112 and the silicon wafer 1. Moreover, an annular recessed portion 116 is formed in a portion of the holding member 112 that faces the pressure-setting stage 80, and the O-ring 117 is fitted into the recessed portion 116 and is compressed by the pressure-setting stage 80 and the holding member 112.

Described below is the operation of the thus constituted pressure-adjusting device for integrated pressure sensors.

The glass seat 6 to which the silicon wafer 1 is joined is placed on the pressure-setting stage 80 in the condition where the holding member 112 is removed from the pressure-setting stage 80. The holding member 112 is then placed from the upper side of the silicon wafer 1 and is secured to the pressure-setting stage 80 by screws 113.

Here, the O-ring 115 maintains the air-tightness between the holding member 112 and the upper surface of the silicon wafer 1, and the O-ring 117 maintains the air-tightness between the holding member 112 and the upper surface of the pressure-setting stage 80. Thus, no O-ring is arranged between the glass seat 6 and the pressure-setting stage 80. The O-rings 114 and 117 are pressed from the upper direction by the holding member 112 to maintain air-tightness in spaces (pressure-adjusting) passages 7, 9a 9b 9c) where the pressure becomes negative, and the silicon wafer 1 is not tilted.

In this condition, the pressure sensitivity is adjusted for each of the chips. That is, the resistance is adjusted by irradiating the adjusting resistor 4 with a laser beam while keeping the prober (needle) in contact with the probing pad 11 (see FIG. 10). This adjustment is carried out by using the vacuum pump 16 and the pressure gauge 117 and by applying atmospheric pressure (760 mmHg) and a negative pressure (2 mmHg) to the diaphragm 2.

After the pressure sensitivity is adjusted, the silicon wafer 1 and the glass plate 6 are cut by dicing for each of the chips.

Figure 24:
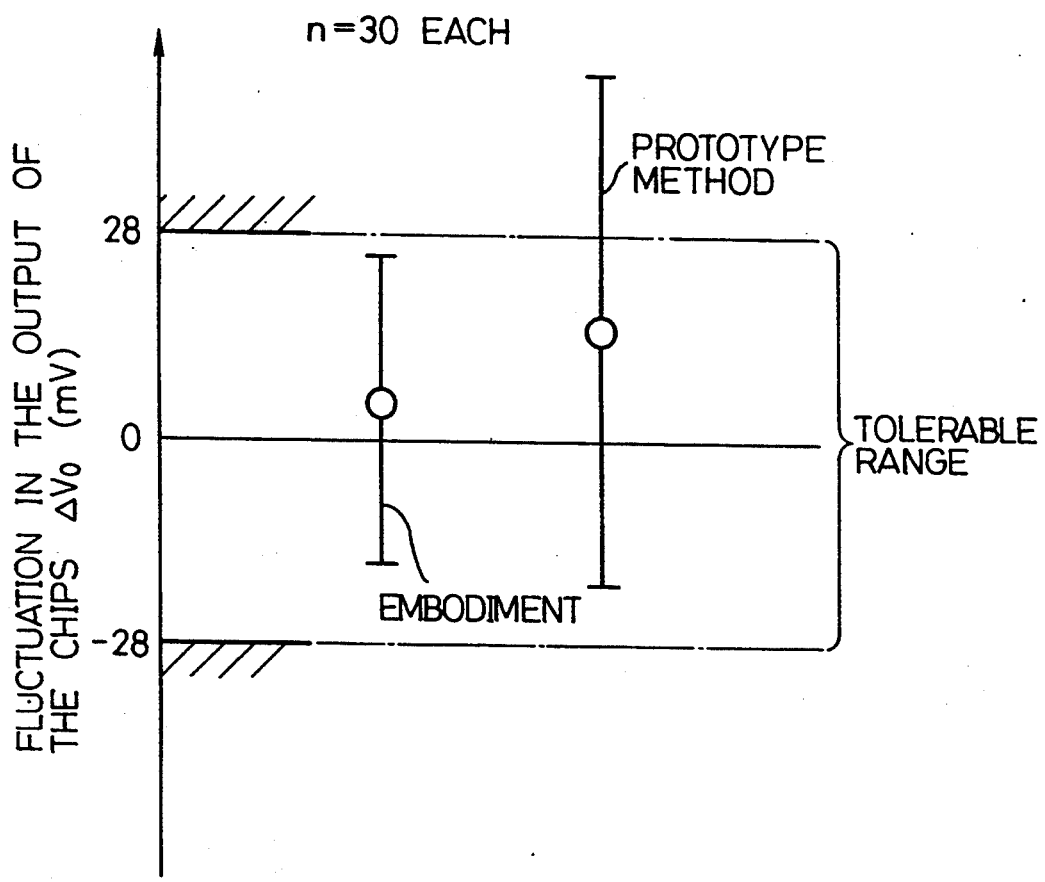
FIG. 24 is a diagram illustrating the measured results of errors in the sensor outputs.

FIG. 24 shows the experimental results related to precision of sensitivity adjustment when the prototype of the pressure-setting stage shown in FIG. 21 is used in comparison with those obtained by using the pressure-setting stage of this embodiment. The experimental results show that when the sensitivity is adjusted using the prototype pressure-setting stage, a silicon wafer that is tilted makes it difficult to control the probing within a predetermined range, i.e., stress from the probing is transmitted to the piezo-resistance layer (gauge resistor) resulting in an error in the output adjustment. In taking the outputs from the chips, furthermore, the prober (needle) cannot be maintained in contact with the pad (electrode) under a constantly controlled condition, and the stress from probing is transmitted to the piezo-resistance layer (gauge resistor) resulting in an error in the output adjustment. Moreover, the outer periphery of the silicon wafer is depressed from the upper direction in order to depress the O-ring 32 of FIG. 22. Therefore, the silicon wafer is distorted by, e.g., being warped, and this externally caused distortion is transmitted to the piezo-resistance layer (gauge resistor) causing the output adjustment to become erroneous. According to this embodiment, on the other hand, air-tightness is maintained in negative-pressure space without any O-ring placed between the glass seat 6 and the pressure-setting stage 8 and, in addition, the O-ring 115 is depressed from the upper surface of the silicon wafer 1 by the holding member 112 without causing the silicon wafer 1 to be tilted. Therefore, a decreased amount of error is involved in the output adjustment.

According to this embodiment as described above, the holding member 112 is placed on the pressure-setting stage 80 so as to surround the outer peripheries of the glass seat 6 and the silicon wafer 1, the O-ring 117 (first elastic air-tight member) is arranged on the pressure-setting stage 80 so as to surround the outer periphery of the glass seat 6 and is held being compressed by the pressure-setting stage 80 and the holding member 12, and the O-ring 115 (second elastic air-tight member) is arranged so as to surround the outer periphery of the upper surface of the silicon wafer 1 and is held being compressed by the silicon wafer 1 and the holding member 112. Accordingly, the sealing property is maintained when the pressure is set, and a decreased amount of error is involved in the output adjustment since the silicon wafer 1 is not tilted.

Fourth Embodiment

Described below is a fourth embodiment with respect to those points which are different from the third embodiment.

Figure 25:
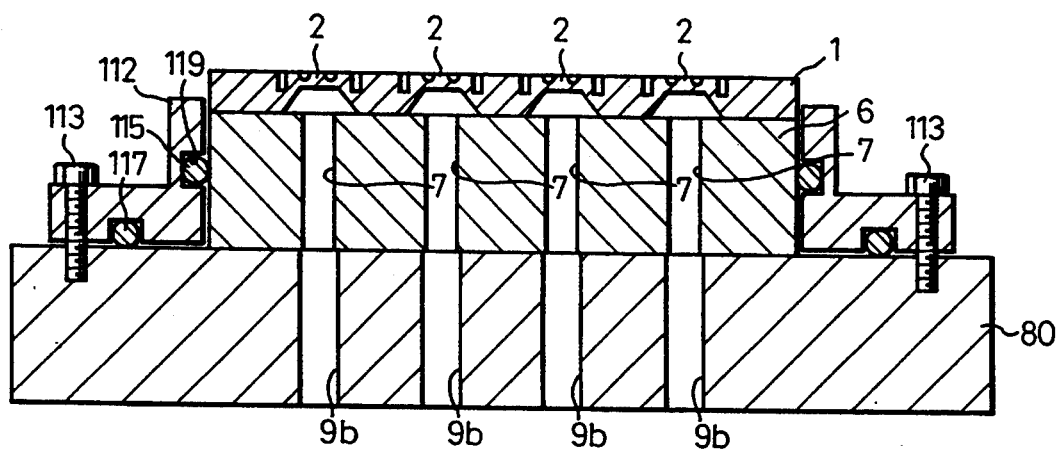
FIG. 25 is a sectional view of the pressure-adjusting device for the integrated pressure sensor according to a fourth embodiment of the present invention.

Referring to FIG. 25, the O-ring 115 is placed along the outer periphery of the side surface of the glass seat 6. That is, an annular recessed portion 119 is formed in the holding member 112 that faces the outer peripheral surface of the glass seat 6, and the O-ring 115 is fitted in the recessed portion 119 to maintain air-tightness between the side surface of the glass seat 6 and the inner peripheral surface of the holding member 119.

By applying this embodiment, furthermore, the O-ring 115 may be placed along the outer periphery of the side surface of the silicon wafer 1.

As described above in detail, this embodiment exhibits excellent effects such as maintaining sealing when pressure is applied and decreasing error in the output adjustment since the silicon wafer is not tilted.

Fifth Embodiment

Considered below are some other problems that arise when the output level or the offset of the pressure sensor is adjusted by trimming the resistance film in a step of effecting the temperature compensation or compensating error due to distortion.

Figure 26:
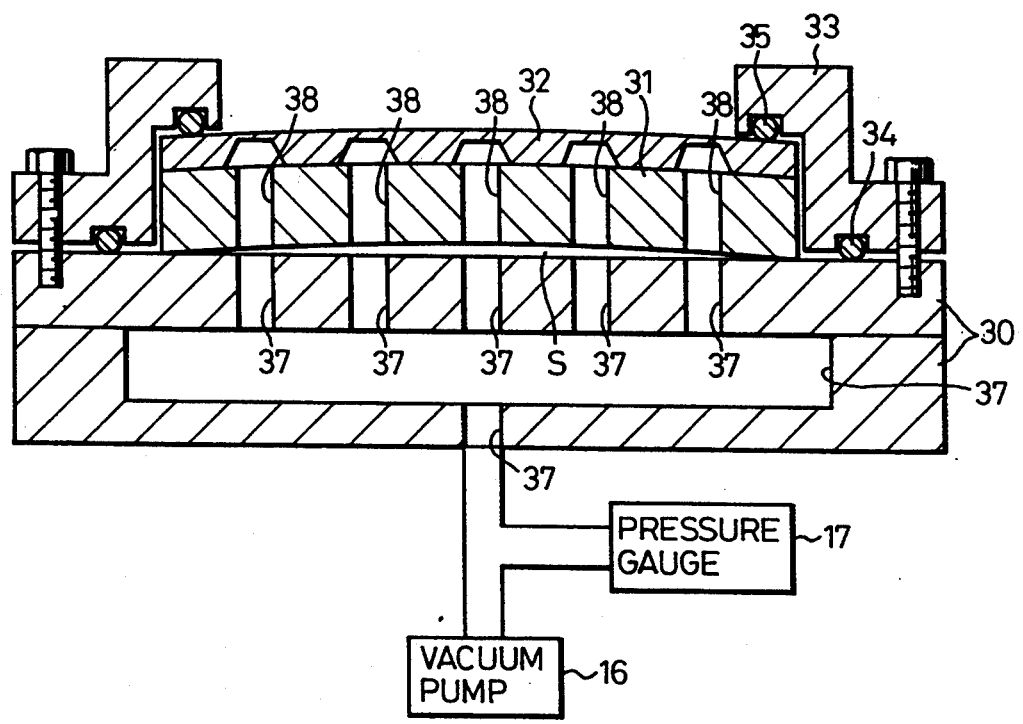
FIG. 26 is a sectional view of the pressure-adjusting device for the integrated pressure sensor according to the device shown in FIG. 23.

The output of the integrated pressure sensor which is in the form of a wafer has heretofore been adjusted (trimmed) by applying a predetermined pressure thereto. FIG. 26 shows a pressure-adjusting device for the integrated pressure sensors. A silicon wafer 32 which is joined to the glass seat 31 is placed on the upper surface of the pressure-setting stage 30, and the outer periphery of the silicon wafer 32 is held by the holding member 33. Air-tightness is maintained by O-rings 34 and 35 between the holding member 33 and the pressure-setting stage 30, and between the holding member 33 and the silicon wafer 32. A pressure created by a vacuum pump 36 is applied to the diaphragms of the silicon wafer 32 via a pressure-adjusting passage 37 in the stage and pressure-adjusting passages 38 in the seat. To adjust the sensor output (to adjust the pressure sensitivity), the resistor is trimmed by irradiation with a laser beam or the like by applying atomspheric pressure and a predetermined negative pressure to the diaphragms so that a difference in the output voltage produced by a distortion guage (piezo-resistance layer) formed in the diaphragm approaches a predetermined value.

Due to the warping of the glass seat 31 or the machining precision for the pressure-setting stage 30, however, a gap (denoted by S in FIG. 26) exists between the glass seat 31 and the pressure-setting stage 30, i.e., when a negative pressure is applied, the glass seat 31 is intimately contacted to the pressure-setting stage 30 such that there exists no gap S. Therefore, stress due to the deflection builds up in the silicon wafer 32 and is transmitted to the distortion gauge (piezo-resistance layer) resulting in an error in the output voltage. That is, stress due to deflection does not develop under atmospheric pressure and no error is contained in the output voltage. Therefore, if a difference in the output voltage under the respective pressures is removed, an error that is generated when the negative pressure is applied remains and turns out to be an error in the output.

Therefore, it becomes necessary to provide a pressure-adjusting device for integrated pressure sensors, that is capable of cancelling the error in the output and of correctly adjusting the output of the wafer.

Figure 27:
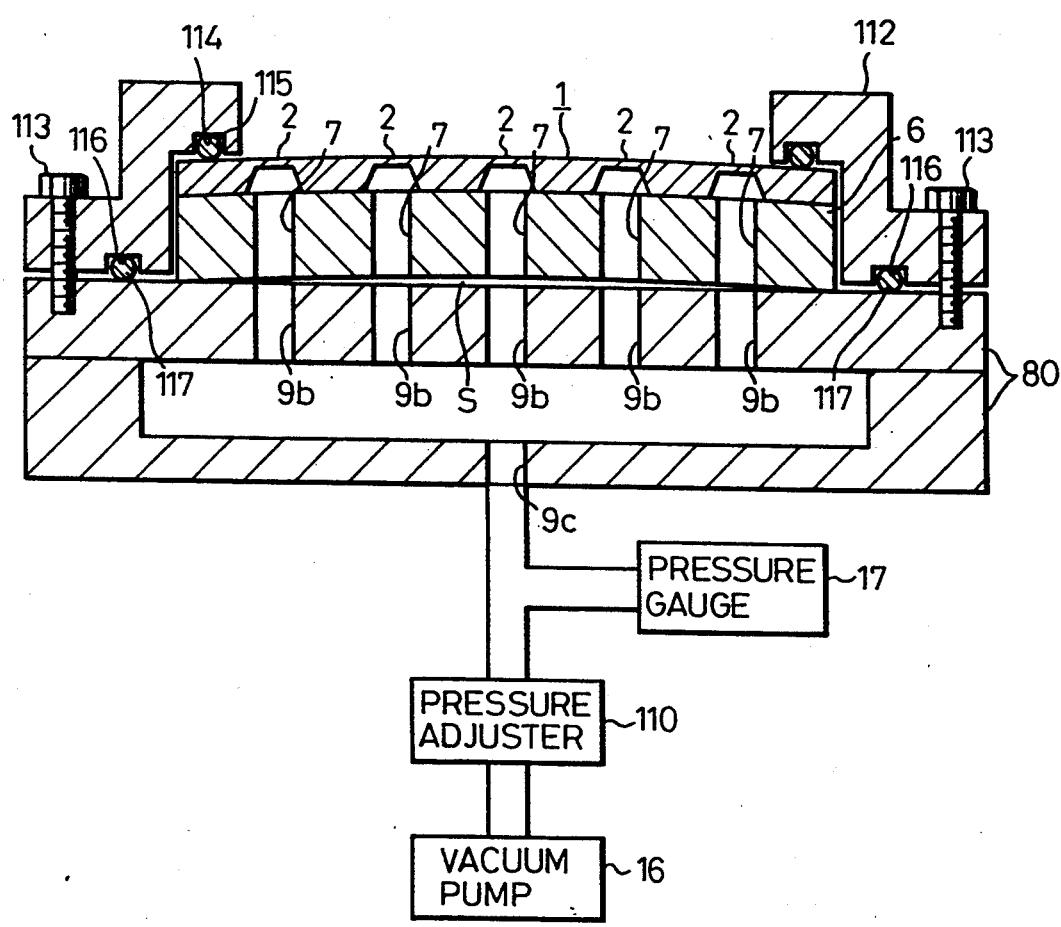
FIG. 27 is a sectional view of the pressure-adjusting device for the integrated pressure sensor according to a fifth embodiment of the present invention.

In order to solve the above problem according to a fifth embodiment, there is provided as shown in FIG. 27 a pressure-adjusting device for adjusting the output of an integrated pressure sensor, which forms in a silicon wafer a signal processing circuit with an adjusting resistor for each of the chips, a thin diaphragm for each of the chips and a piezo-resistance layer for each of the chips, the device for adjusting the output of an integrated pressure sensor comprising a pressure-setting stage on which is placed the silicon wafer or a seat to which the silicon wafer is joined and which has pressure-adjusting passages formed therein to adjust the pressure exerted on the diaphragms, a holding member which air-tightly holds the outer periphery of the silicon wafer on the pressure-setting stage, and a pressure-adjusting means that applies first and second negative pressures that are sufficient for bringing the silicon wafer or the seat into intimate contact with the pressure-setting stage, the first and second negative pressures being applied to the diaphragms of the silicon wafer via the pressure-adjusting passages formed in the stage in the open atmosphere.

That is, the pressure sensitivity is adjusted in the open atmosphere using first and second negative pressures which are sufficient for eliminating gaps formed between the pressure-setting stage and the seat, and between the pressure-setting stage and the silicon wafer. Namely, an output error generated due to the deflection of the silicon wafer is contained in an equal amount in the first negative pressure and in the second negative pressure, so that error is offset.

The above fifth embodiment will not be concretely described in conjunction with the drawings.

FIG. 27 illustrates the overall constitution of the pressure-adjusting device for integrated pressure sensors. The silicon wafer 1 has the same constitution as the one described with reference to FIG. 23.

In FIG. 27, furthermore, the glass seat 6 and the silicon wafer 1 have the same relationship as the one described with reference to FIG. 23.

In FIG. 27, the pressure-setting stage 80 has pressure-adjusting passages 9a, 9b and 9c formed therein, the end on one side of the pressure-adjusting passage 9c being open on the lower surface, the end on the other side thereof being communicated with the pressure-adjusting passage 9a which is branched into many passages 9b.

The ends on the other side of the pressure-adjusting passages 9b are open in the upper surface of the pressure-setting stage 80 so as to be opposed to the openings on one side of the pressure-adjusting passages 7 formed in the glass seat 6. The pressure-adjusting passage 9c in the stage is connected to the vacuum pump 16 via a pressure adjuster 110 which serves as a pressure-adjusting means. The pressure in the pressure-adjusting passages 9a, 9b and 9c in the stage is rendered to be negative by the vacuum pump 16. The pressure adjuster 10 adjusts the pressure in the pressure-adjusting passages 9a, 9b and 9c in the stage into predetermined values, i.e., −60 mmHg (gauge pressure) and −758 mmHg (gauge pressure). That is, the pressure is adjusted to 700 mmHg (absolute pressure) and 2 mmHg (absolute pressure). A pressure gauge 12 is connected to the pressure-adjusting passage 9c in the pressure-setting stage 80.

The glass seat 6 to which the silicon wafer 1 is joined is placed on the pressure-setting stage 80.

The holding member 112 is secured to the upper surface of the pressure-setting stage 80 by screws 113. The holding member 112 has a shape that covers the outer peripheries of the glass seat 6 and the silicon wafer 1 and further covers the upper periphery of the silicon wafer 1.

An annular recessed portion 15 is formed in a portion of the holding member 112 that faces the upper surface of the silicon wafer 1, and the O-ring 115 is fitted in the recessed portion 114 and is compressed by the holding member 112 and the silicon wafer 1. Moreover, an annular recessed portion 116 is formed in a portion of the holding member 112 that faces the pressure-setting stage 80, and the O-ring 117 is fitted into the recessed portion 116 and is compressed by the pressure-setting stage 80 and the holding member 112.

Described below is the operation of the thus constituted pressure-adjusting device for integrated pressure sensors.

The glass seat 6 to which the silicon wafer 1 is joined is placed on the pressure-setting stage 80 in the condition where the holding member 112 is removed from the pressure-setting stage 80. The holding member 112 is then placed from the upper side of the silicon wafer 1 and is secured to the pressure-setting stage 80 by screws 113.

Here, the O-ring 115 maintains the air-tightness between the holding member 112 and the upper surface of the silicon wafer 1, and the O-ring 117 maintains the air-tightness between the holding member 112 and the pressure-setting stage 80.

In this condition, the pressure sensitivity is adjusted for each of the chips. That is, the resistance is adjusted by irradiating the adjusting resistor 4 with a laser beam while keeping the probe (needle) 10 in contact with the probing pad 11 (see FIG. 10). This adjustment is carried out by using the vacuum pump 16 and the pressure gauge 17 and by applying −60 mmHg (gauge pressure) and −758 mmHg (gauge pressure) to the diaphragm 2 in an open atmosphere. The pressures −60 mmHg and −758 mmHg are sufficient for intimately contacting the glass seat 6 to the pressure-setting stage 80 despite the glass plate 6 and the silicon wafer 1 being warped to develop a gap S between the glass seat 6 and the pressure-setting stage 80.

After the pressure sensitivity is adjusted, the silicon wafer 1 and the glass plate 6 are cut by dicing for each of the chips.

Figure 28:
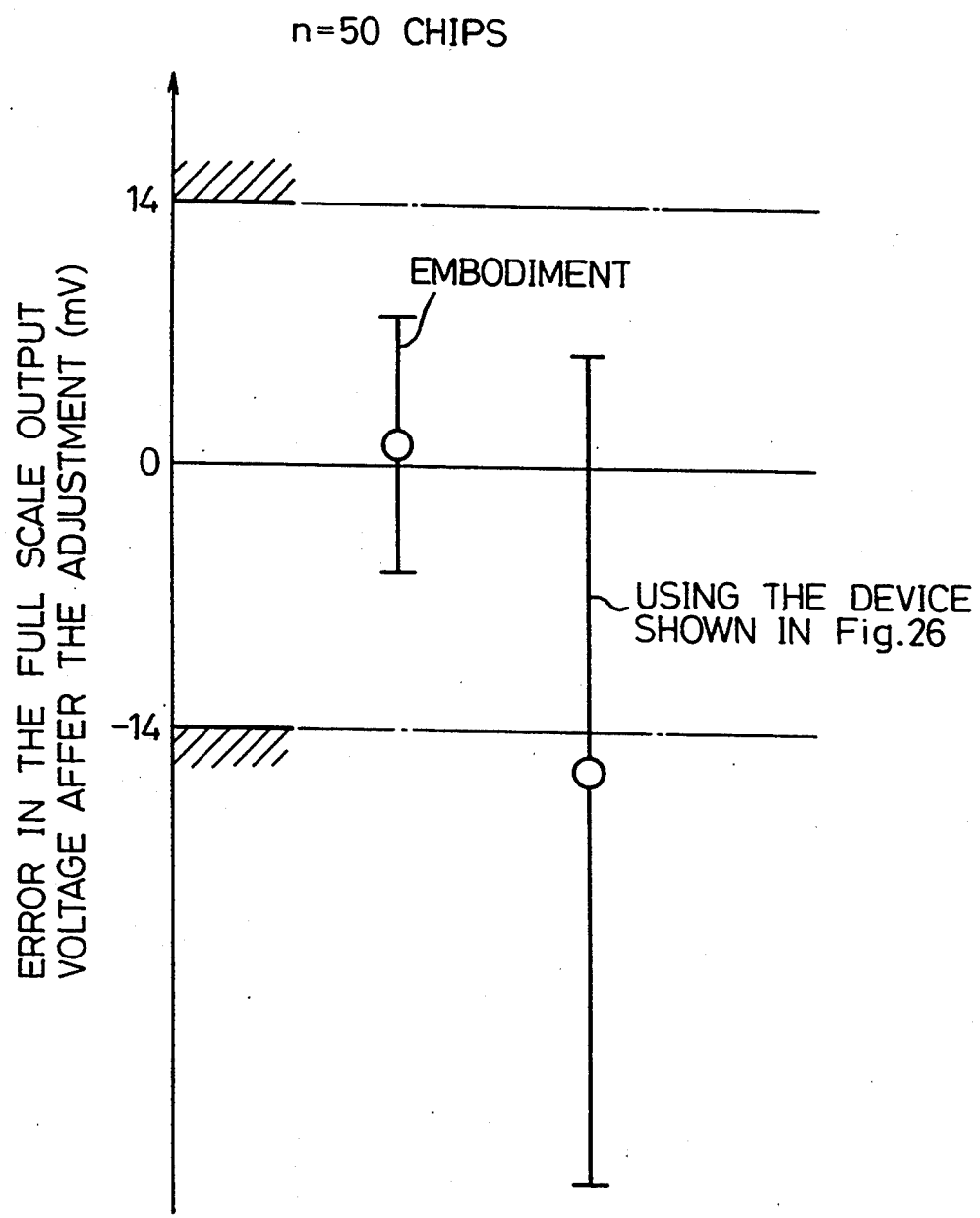
FIG. 28 is a diagram illustrating the measured results of errors in the sensor outputs.

FIG. 28 shows the experimental results related to precision of sensitivity adjustment when the sensitivity is adjusted by applying atmospheric pressure and a predetermined negative pressure to the diaphragm using the device of FIG. 26 (corresponding to the third embodiment), and when the sensitivity is adjusted by applying −60 mmHg (gauge pressure) and −758 mmHg (gauge pressure) to the diaphragm by using the device of this embodiment. The experimental results show that when a negative pressure is applied by using the device shown in FIG. 26, the gap S is eliminated between the glass seat 31 and the pressure-setting stage 30, i.e., the glass seat 31 is intimately contacted to the pressure-setting stage 30. Accordingly, stress builds up in the silicon wafer 32 due to its deflection, and is transmitted to the distortion gauge (piezo-resistance layer) resulting in the development of an error in the output voltage.

When the device of this embodiment is used, however, an output error due to the deflection of the silicon wafer 1 is contained in an equal amount in the first negative prssure of −60 mmHg (gauge pressure) and in the second negative pressure of −758 mmHg (gauge pressure), so that the error is offset in the difference between the output voltages at two negative pressures. Therefore, a small error is involved in the output adjustment as shown in FIG. 28.

According to the fifth embodiment as described above, the first negative pressure of −60 mmHg and the second negative pressure of −758 mmHg that are sufficient for bringing the glass seat 6 into intimate contact with the pressure-setting stage 80 are applied by the pressure ajuster 110 to the diaphragms 2 of the silicon wafer 1 via the pressure-adjusting passages 8a, 9b and 9c in this stage in the open atmosphere. Therefore, the output error caused by the dection of the silicon wafer 1 is contained in an equal amount in the first negative pressure and in the second negative pressure, and the error is offset in the difference between the output voltages, making it possible to more precisely adjust the output of the chips which are still in the form of wafers.

Figure 29:
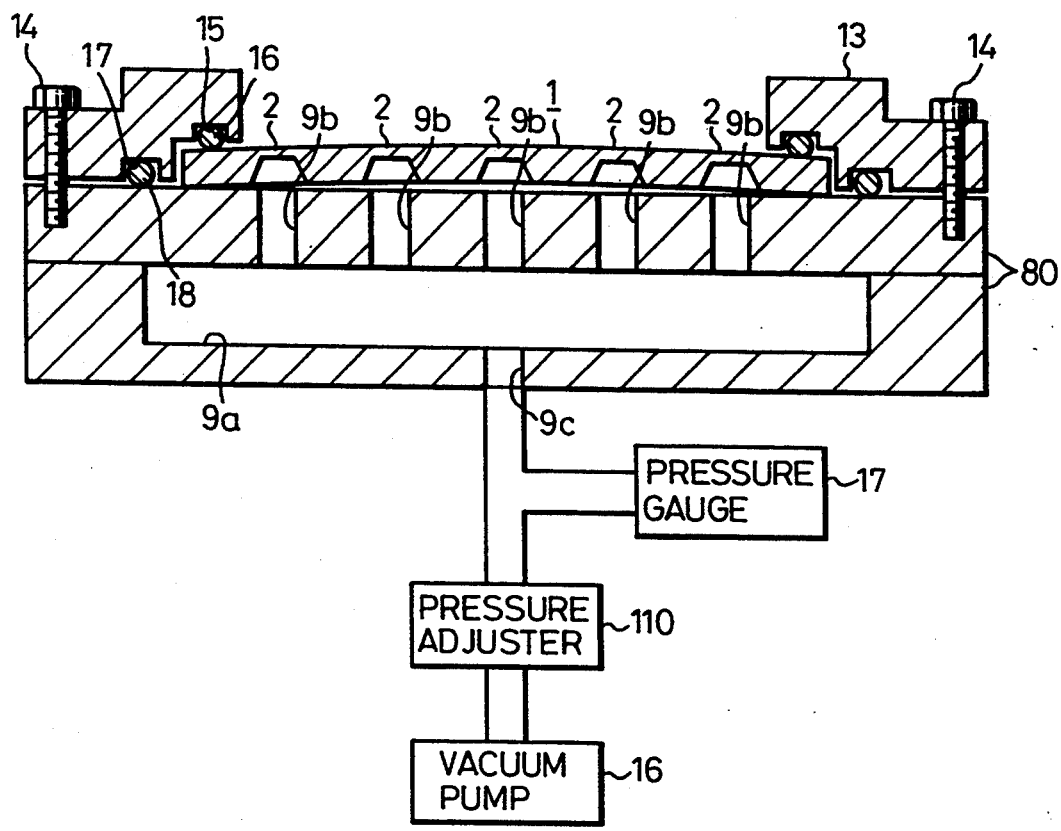
FIG. 29 is a sectional view of another example of the pressure-adjusting device for the integrated pressure sensor.

This embodiment is in no way limited to the case described above, but may further apply to the case of trimming the silicon wafer 1 which is not joined to the glass seat corresponding to the second embodiment as shown in FIG. 29. The silicon wafer 1 is likely to be warped by the formation of the diaphragms 2.

As described above in detail, this embodiment exhibits excellent effects in that the output of the chips can be correctly ajusted while they are still in the form of a wafer.

Sixth Embodiment

In the aforementioned pressure-adjusting devices for the integrated pressure sensors, however, difficulty is involved in probing the chips on the outer periphery of the silicon wafer 32 which is covered by the holding member 112, so cumbersome operation is required for mounting the holding member 112, and air-tightness is deteriorated as the O-rings 115 and 117 are worn out.

Therefore, the next embodiment provides a pressure-adjusting device for integrated pressure sensors, which is capable of adjusting the output of the chips which are still in the form of a wafer while maintaining air-tightness without using the holding member 112.

This embodiment deals with a pressure-adjusting device for adjusting the output of an integrated pressure sensor which forms a silicon wafer a signal processing circuit with an adjusting resistor for each of the chips, a thin diaphragm for each of the chips and a piezo-resistance layer for each of the chips, the pressure-adjusting device comprising a pressure-setting stage on which is placed the silicon wfer or a seat to which the silicon wafer is joined and which has pressure-adjusting passages formed therein to adjust the pressure that is exerted on the diaphragms, a groove formed in the upper surface of the pressure-setting stage so as to face the silicon wafer outer periphery of the seat yet surrounding the outer periphery of the silicon wafer or the seat, a magnet secured in the groove, and a magnetic fluid filled in the groove to maintain air-tightness between the pressure-setting stage and the silicon wafer or seat.

According to this embodiment, the groove is formed in the upper surface of the pressure-setting stage so as to surround the outer periphery of the silicon wafer or the seat, the magnet is secured in the groove, and the magnetic fluid is filled in the groove. The magnetic fluid matains the air-tightness between the pressure-setting stage and the silicon wafer or the seat. The pressure applied to the diaphragms is adjusted via the pressure-adjusting passages in the stage in the condition where the sealing is accomplished by the magnetic fluid, and then the adjusting resistor of the signal processing circuit is trimmed.

A sixth embodiment will now be described in conjunction with the drawings.

Figure 30:
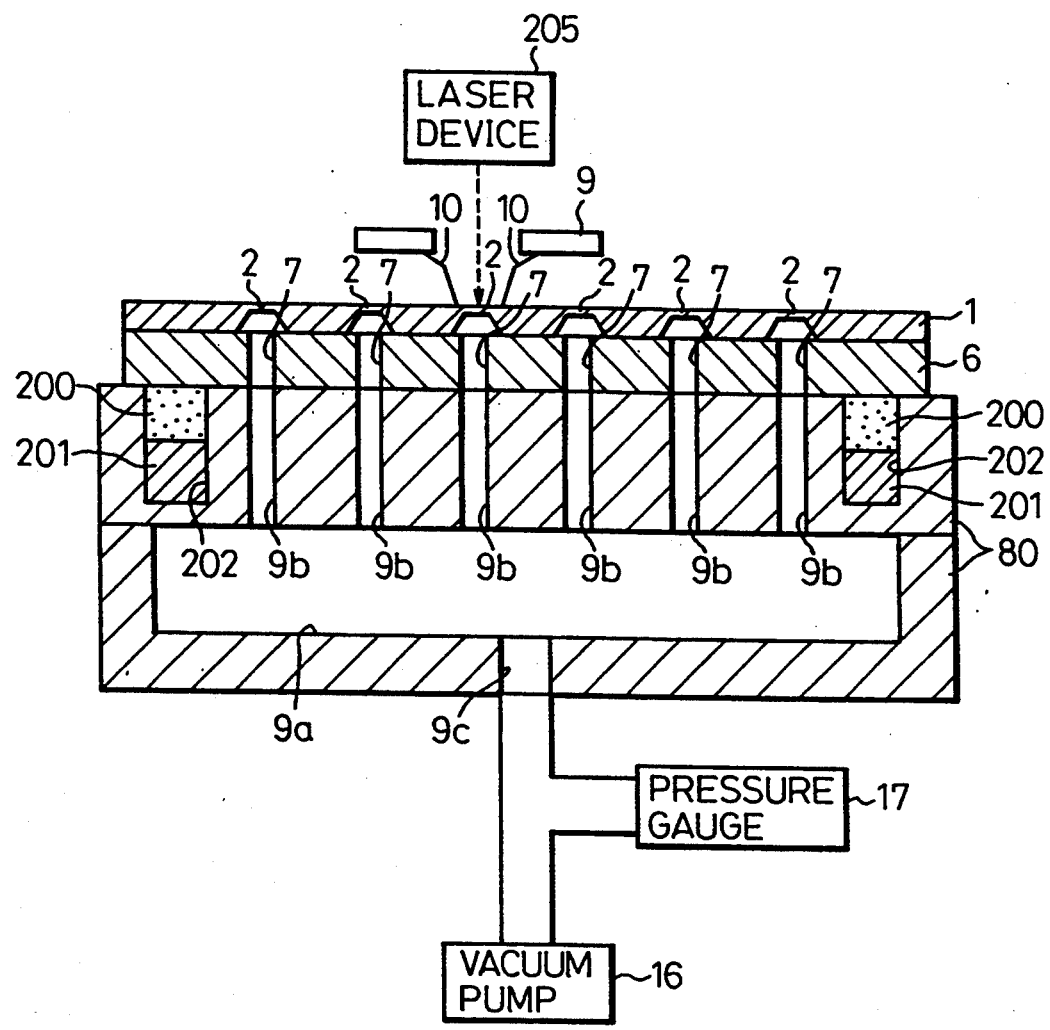
FIG. 30 is a sectional view of the pressure-adjusting device for the integrated pressure sensor according to a sixth embodiment of the present invention.

FIG. 30 illustrates the overall constitution of the pressure-adjusting device for integrated pressure sensors, which is the same as the constitution of FIG. 23, except that the holding member 112 and screws 113 used in FIG. 23 are not used in this embodiment. Furthermore, the pressure-setting stage 8 is made of a resin which is a non-magnetic material. The pressure-setting stage 80 has pressure-adjusting passages 9a, 9b and 9c formed therein. The end on one side of the pressure-adjusting passage 9c is open in the lower surface, the end on the other side thereof is communicated with the pressure-adjusting passage 9a which is branched into may passages 9b. The ends on the other side of the pressure-adjusting passages 9b are open in the upper surface of the pressure-setting stage 80 so as to be opposed to the ends that are open on one side of the pressure-adjusting passages 7 formed in the glass seat 6. The pressure-adjusting passage 9c in the stage is connected to the vacuum pump 16 which renders the pressure in the pressure-adjusting passages 9a, 9b and 9c in the stage negative. A pressure gauge 17 is connected to the pressure-adjusting passage 9c in the pressure-setting stage 80.

A glass seat 6 to which the silicon wafer 1 is joined is placed on the pressure-setting stage 80.

A groove 202 is formed in the upper surfaces of the pressure-setting stage 8 in a circular shape so as to be opposed to the lower surface of the outer periphery of the glass seat 6 and to surround the outer periphery of the seat 6. A permanent magnet 201 is secured to the bottom in the groove 202 throughout the whole length. Furthermore, a magnetic fluid 200 is filled in the groove 202. The magnetic fluid 200 is obtained by dispersing fine iron particles in an oil and has a viscoity of about 10000 cSt (centristokes).

The operation of the thus constituted pressure-adjusting device for integrated pressure sensors will now be described.

The glass seat 6 to which the silicon wafer 1 is joined is placed on the pressure-setting stage 80 under the condition where the magnetic fluid 200 is filled in the groove 202. In this case, the air-tightness is maintained by the magnetic fluid 200 between the lower surface of the glass seat 6 and the upper surface of the pressure-setting stage 80.

Under this condition, the pressure sensitivity is adjusted for each of the chips. That is, the resistance is adjusted by irradiating the adjusting resistor 4 with a laser beam from a laser device 205 while keeping the prober (needle) 10 in contact with the probing pad 11 (see FIG. 10). This adjustment is carried out by using the vacuum pump 16 and the pressure gauge 17 and by applying atmopheric pressure and a predetermined negative pressure ($-758$ mmHg is gauge pressure) to the diaphragms 2.

Figure 31:
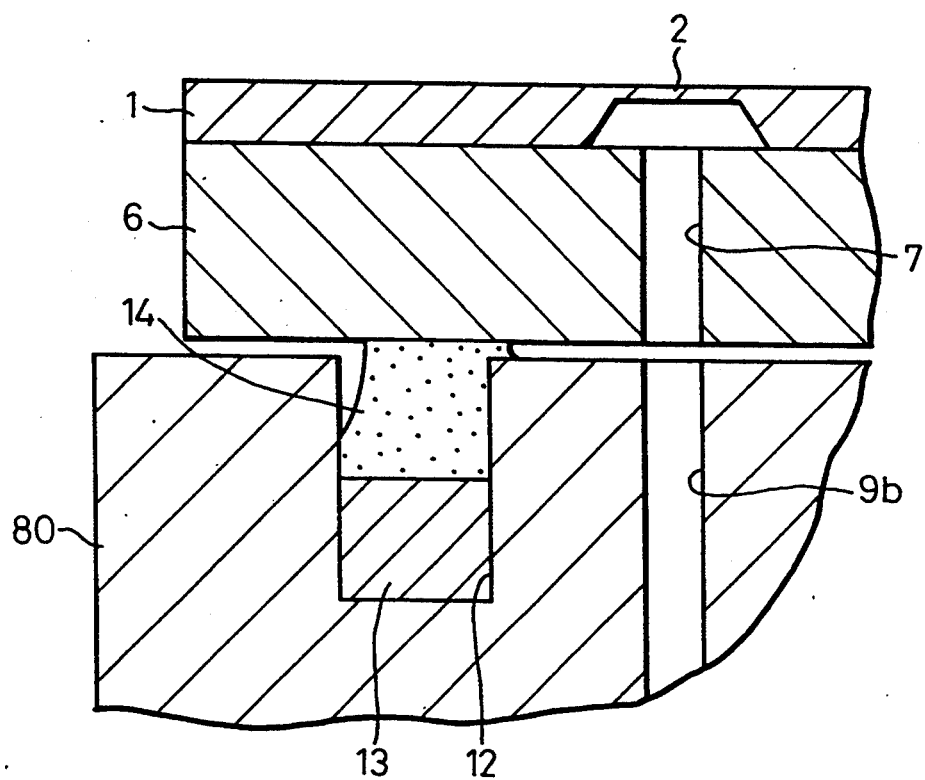
FIG. 31 is a diagram illustrating on an enlarged scale a major portion of the pressure-adjusting device for the integrated pressure sensor.

At the time of applying the negative pressure, a small gap between the glass seat 6 and the pressure-setting stage 80 is sealed by the magnetic fluid 200 as shown in FIG. 31. Due to its viscosity and being attracted by the permanent magnet 201, the magnetic fluid 200 does not flow into the pressure-adjusting passages 9a in the pressure-setting stage 80 passing through the gap.

After the pressure sensitivity is adjusted, the silicon wafer 1 and the glass seat 6 are removed from the pressure-setting stage 80. At this moment, since the magnetic fluid 200 is attracted by the permanent magnet 201, the magnetic fluid 200 adheres in a smallest amount to the glass seat 6.

Thereafter, the silicon wafer 1 and the glass seat 6 are cut by dicing for each of the chips.

Figure 33:
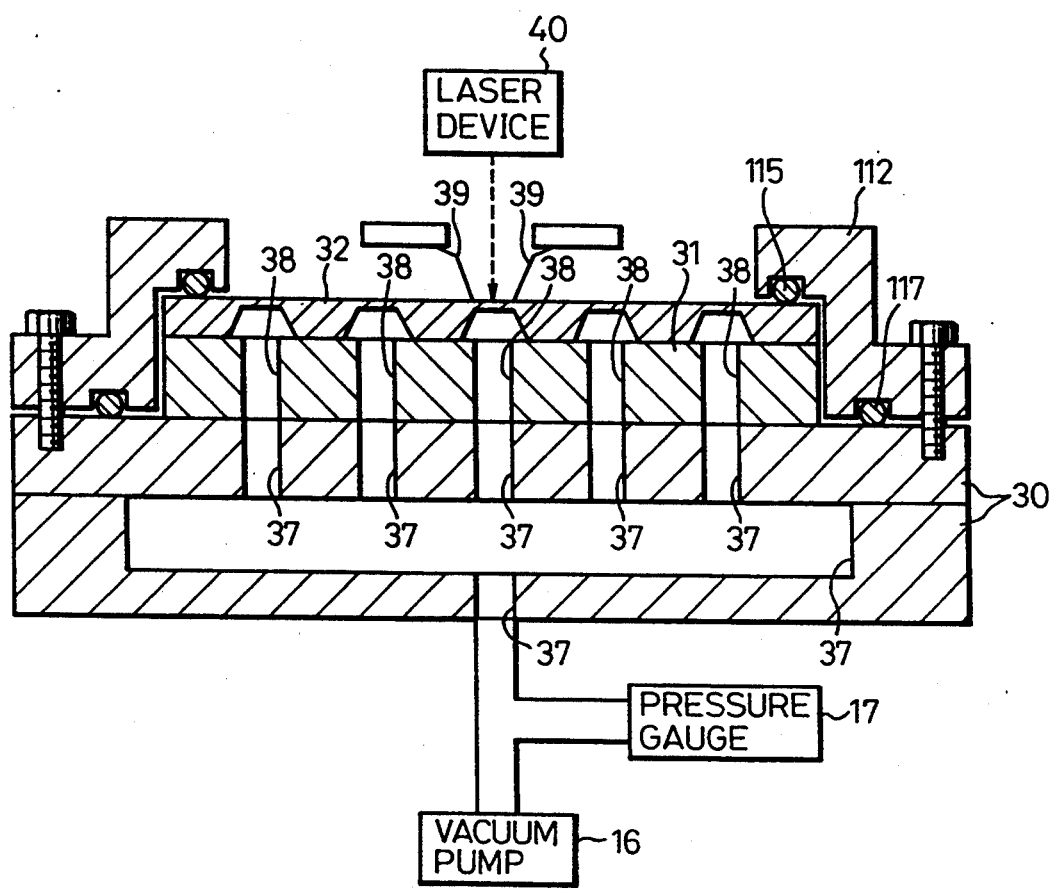
FIG. 33 is a sectional view of the pressure-adjusting device for the integrated pressure sensor according to the device shown in FIG. 23.

According to this embodiment as described above, the groove 202 is formed in the upper surface of the pressure-setting stage 80 so as to face the lower surface of the outer periphery of the glass seat 6 and to surround the outer periphery of the glass seat 6, the permanent magnet 201 is secured in the groove 202, and the magnetic fluid 200 is filled in the groove 202 in order to maintain air-tightness between the pressure-setting stage 80 and the glass seat 6 by the magnetic fluid 200. Therefore, the air-tightness is maintained without using the holdig member 112 and O-rings 115, 117 shown in FIG. 33 corresponding to the third embodiment, and the output of the chips can be adjusted while they are still in the form of a wafer. That is, since there is no holding member 112 on the upper surface of the silicon wafer 1, the probing can be effected up to the outermost periphery of the silicon wafer 1. Moreover, there is not probability of wear of the o-rings since they are not used, and the only regular maintenance that is needed is simply to replenish the magnetic fluid 200. Furthermore, a high degree of air-tightness can be realized based on a simple setting.

Figure 32:
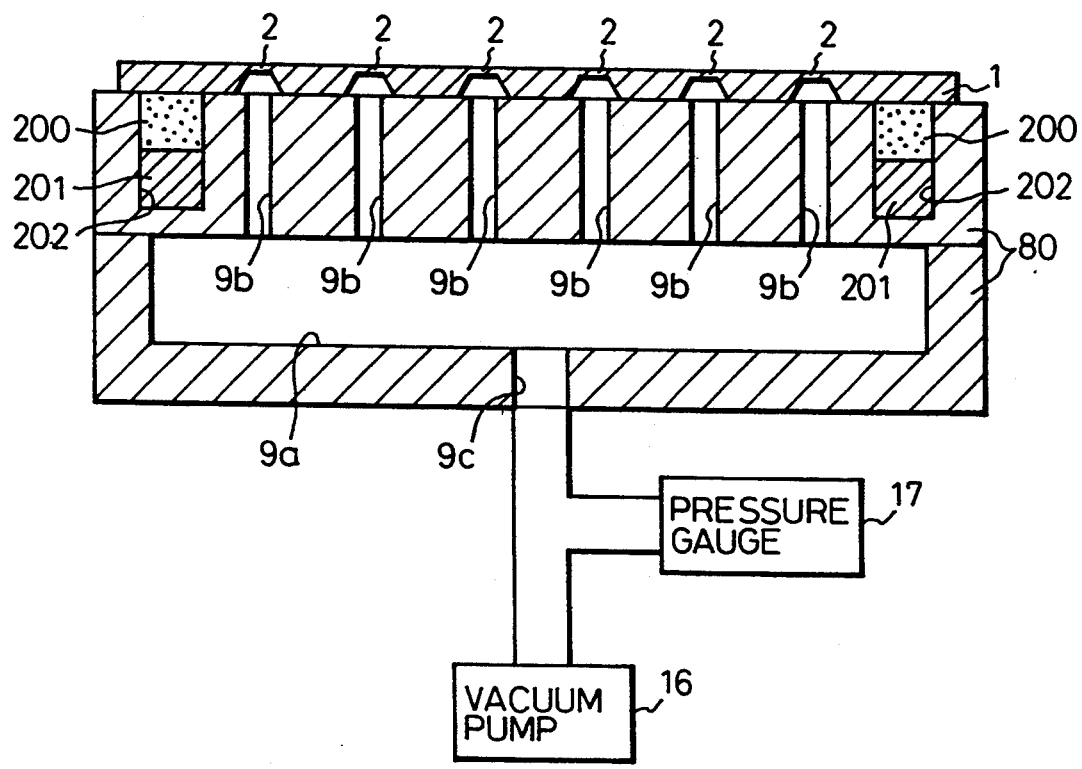
FIG. 32 is a sectional view of another example of the pressure-adjusting device for the integrated pressure sensor.

This embodiment is in no way limited to the above-mentioned one and may further be applied to the case of trimming the silicon wafer 1 which is not joined to the glass seat corresponding to the second embodiment as shown in FIG. 32.

As described above in detail, this embodiment exhibits excellent effects in that the output of the chips can be adjusted while they are still in the form of a wafer by maintaining air-tightness without using a holding member.

Seventh Embodiment

Described below is a seventh embodiment of the integrated pressure sensor of the present invention.

The pressure sensors have heretofore been classified into those of the type in which the pressure is introduced from the lower side of the diaphragm and a relative pressure difference between the above pressure and a pressure allied to the outer surface of the pressure sensor is detected as described in the first embodiment or in the third to sixth embodiments, those of the type in which the interior of the diaphragm of the pressure sensor is hermetically sealed under a vacuum and the pressure applied to the external portion of the pressure sensor is detected as an absolute value as described in the second embodiment, and those of the type in which the pressure is introduced from the lower side of the diaphragm of the pressure sensor, the outer surface of the pressure sensor is maintained under a vacuum, and the pressure input to the diaphragm is detected as an absolute pressure as described in the first embodiment or in the third to sixth embodiments.

Here, the integrated pressure sensor according to the second embodiment shown in FIGS. 16 to 19 is the one which is designed to measure as an absolute pressure the pressure that is applied to the diaphragm surface from the upper side of the diaphragm surface and is, generally, used as an atmospheric pressure sensor. This pressure sensor is particularly useful for detecting lean pressure at high altitudes to control an engine.

Figure 34:
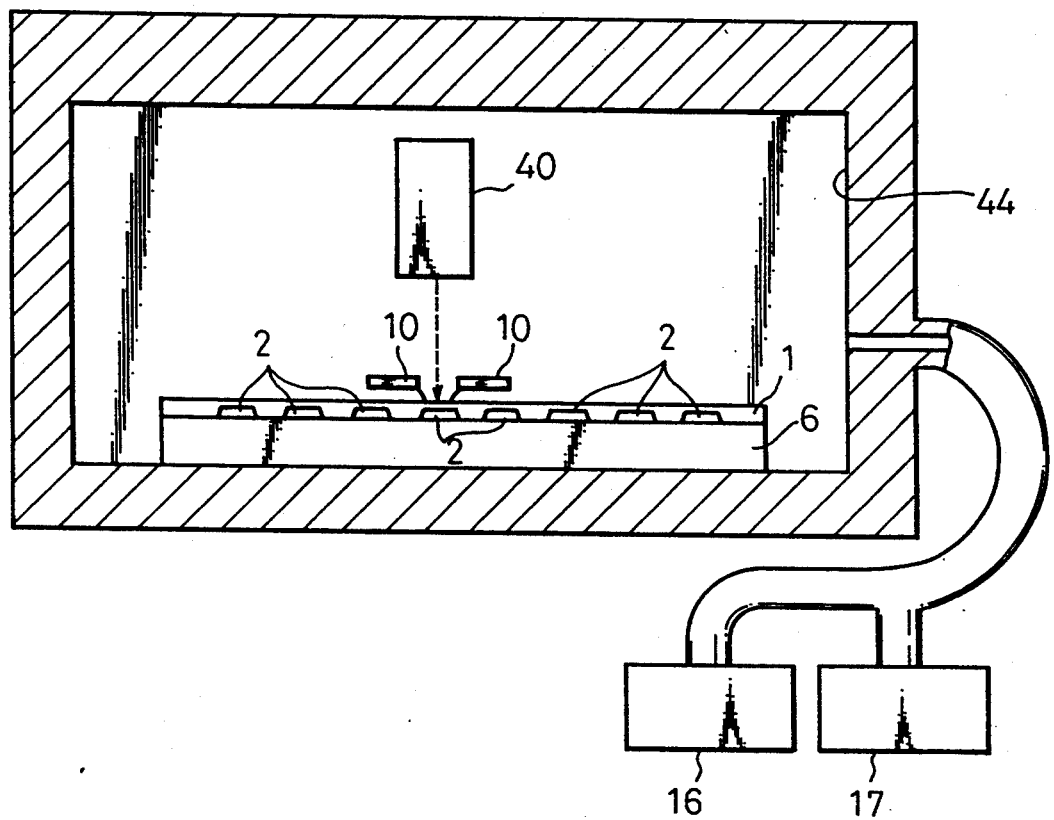
FIG. 34 is a diagram illustrating the steps for fabricating the integrated pressure sensor of the absolute pressure detection system.

There has been known a semiconductor pressure sensor of the absolute pressure type having a pressure reference chamber (e.g., see Japanese Unexamined Patent Publication (Kokai) No. 62-212539). Fabrication of the semiconductor pressure sensor for measuring the absolute pressure has been done by adjusting (trimming) the output by applying a predetermined pressure to the sensor which is in the form of a wafer. In this case as shown in FIG. 34, the silicon wafer 1 is joined to the seat 6 so that recessed portions 2 of the diaphragm serve as pressure reference chambers. The silicon wafer 1 under this condition is placed in the chamber 44, the pressure in the chamber 44 is reduced to a predetermined negative pressure by the vacuum pump 16, and by using the prober 10, the resistor is trimmed with a laser beam from a laser device 40.

However, the laser device 40 and the prober 10 that are arranged in the chamber 44 makes the output adjustment cumbersome.

The seventh embodiment is directed to improving on the aforementioned problem inherent in the integrated semiconductor pressure sensor of the absolute pressure type of the second embodiment, and provides a pressure sensor which enables the output to be easily adjusted, and a method of fabricating the same.

Figure 35:
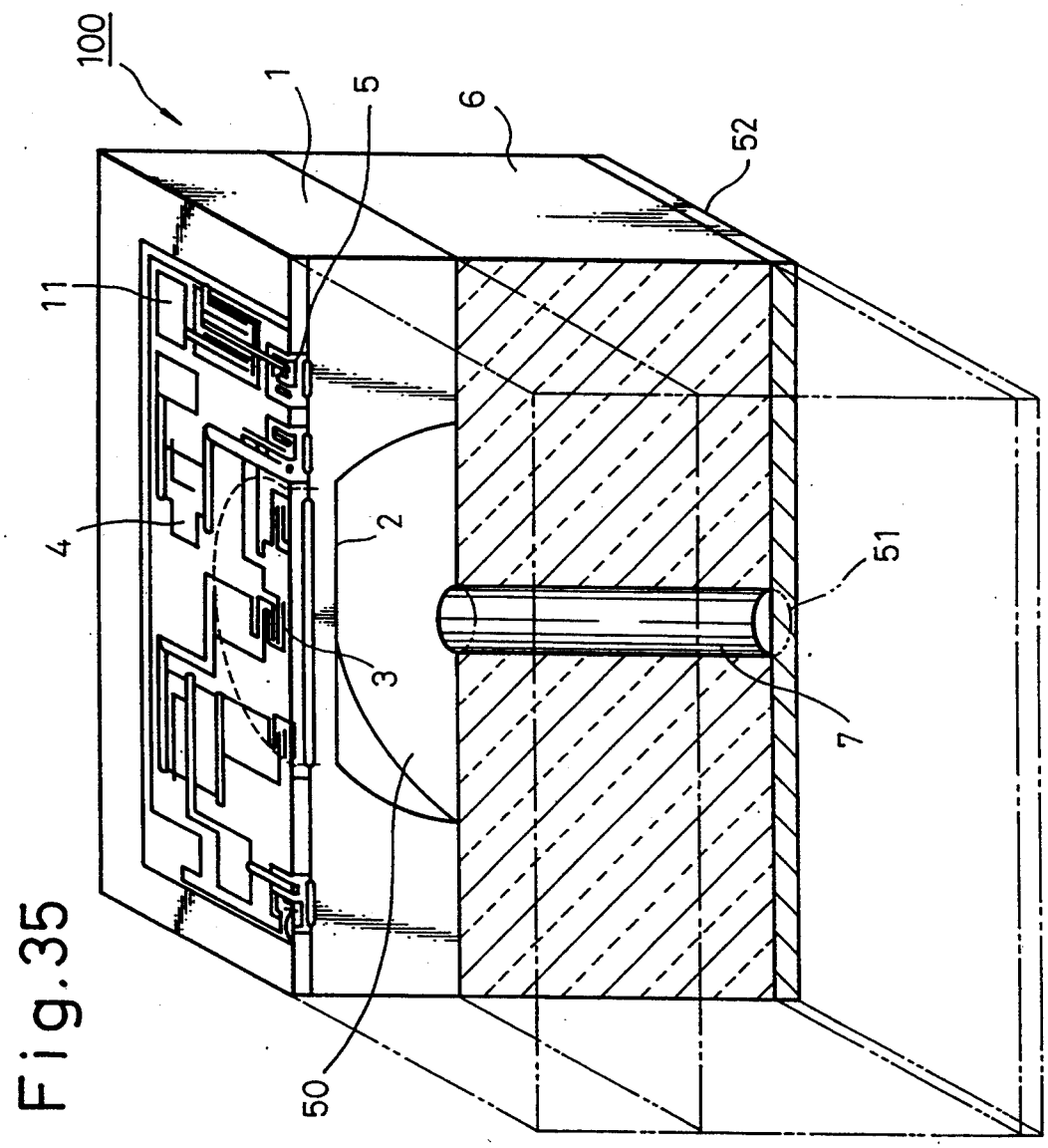
FIG. 35 is a perspective view of the integrated pressure sensor obtained according to a seventh embodiment or an eighth embodiment.

FIG. 35 illustrates an example of the constitution of the integrated pressure sensor obtained according to this embodiment. That is, as shown in FIG. 35, the integrated pressure sensor 100 obtained according to this embodiment comprise a pressures sensor chip 1 in which are formed a signal proceasing circuit 5 having an adjusting resistor 4, a thin diaphragm 2, and a piezo-resistance layer 3; and a seat 6 which is joined to said pressure sensor chip 1 and has a pressure-adjusting passage 7 which is communicated with the diaphragm 2 of the pressure sensor chip. In this integrated pressure sensor 100, an end of the pressure-adjusting passage 7 of the seat 6 is sealed as designated at 51, and a hermetically sealed pressure reference portion 50 is constituted by the diaphragm 2 and by the pressure-adjusting passage 7.

Figure 36:
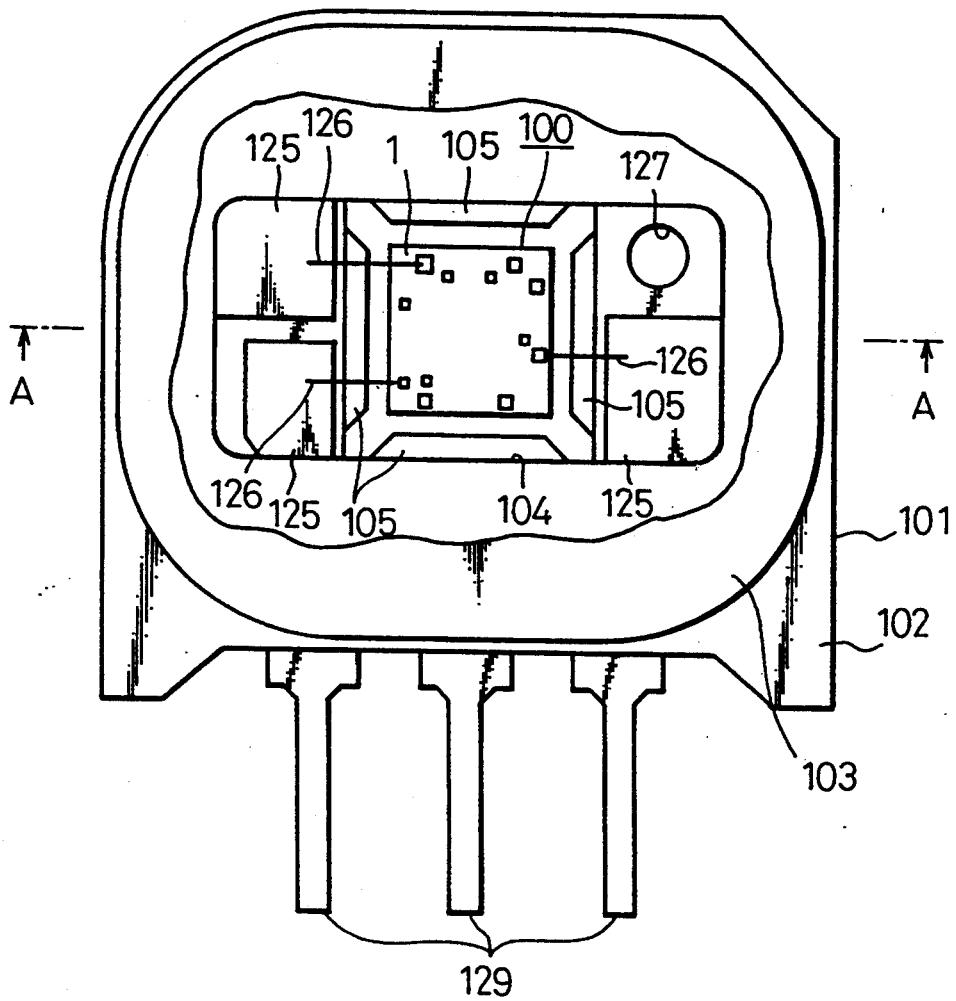
FIG. 36 is a plan view of the integrated pressure sensor which is packaged according to the seventh or eighth embodiment.
Figure 37:
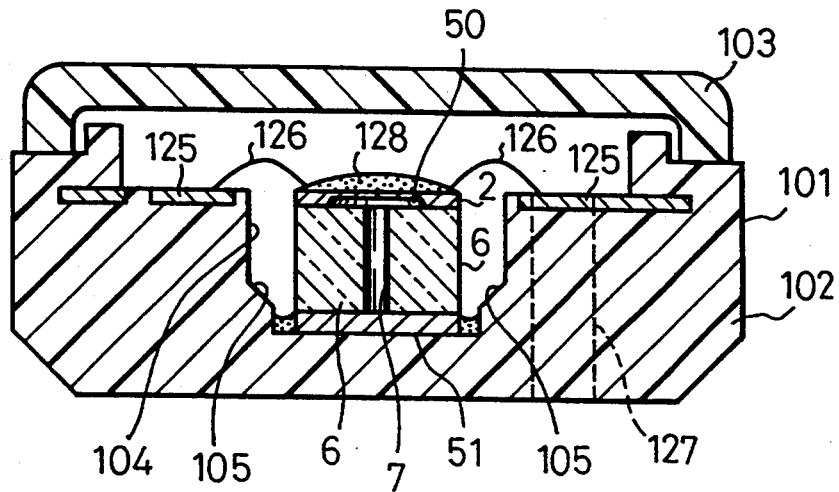
FIG. 37 is a sectional view along A—A of FIG. 36.

FIGS. 36 and 37 illustrate the integrated pressure sensor 100 that is packaged. A plastic closed case 101 has a case body 102 and a covering member 103 which covers the upper surface of the case body 102 being intimately adhered thereto along its outer peripheral edge with a resin bond. The case body 102 is thick as a whole and the inner wall surface thereof forms a rectangular recessed portion 104 with a deep center. In the recessed portion 104 is formed a guide protuberance 105 that inwardly protrudes from the walls of the four sides close to the bottom surface thereof. The integrated pressure sensor 100 is joined with a resin bond onto the bottom surface of the recessed portion 104 with its outer periphery being close to the guide protuberance 105.

As shown in FIG. 35, the integrated pressure sensor 100 has the thin diaphragm 2 formed for each of the pressure sensor chips (silicon chips) 1, the piezo-resistance layer (guage resistance) 3 formed for each of the chips, and the signal processing circuit 5 having a adjusting resistor (thin-film resistance) 4 formed for each of the chips. That is, the central portion is thinly formed to constitue the diaphragm 2 in which is formed the piezo-resistance layer 3 by diffusing impurities, and the signal processing circuit 5 having the adjusting resistor 4 is integrally formed on the thick portion other than the diaphragm 2. The signal processing circuit 5 amplifies the signals formed by the piezo-resistance layer 3.

The pressure sensor chip 1 is anodically joined onto the glass seat 6. As the pressure sensor chip 1 and the glass seat 6 are joined together, the opening of the recessed portion of the diaphragm 2 is closed thereby to form the pressure reference chamber 50. In the glass seat 6 is formed a pressure-adjusting passage 7 for the seat that corresponds to the diaphragm 2 of the pressure sensor chip 1, and one end of the passage 7 is opened in the pressure reference chamber 50 and the other end thereof is opened in the lower surface.

A silicon chip 51 which is a sealing member is joined to the lower surface of the glass seat 6, and seals the lower end 50 of the pressure-adjusting passage 7 in the glass seat 6.

Referring to FIGS. 36 and 37, the outer periphery of inner walls of the recessed portion 104 of the case body has a height nearly the same as the upper surface of the pressure sensor chip 1, and terminal plates 125 are buried in three places on the outer periphery of the inner walls. The terminal plates 125 are connected to the pressure sensor chip 1 via bonding wires 126. A pressure-introducing hole 127 is formed penetrating through the case body 102 in the up-and-down direction at a position close to the terminal plate 125, and the atomspheric pressure is introduced into the closed case 101 through the pressure-introducing hole 127. Since the pressure-introducing hole 127 is formed in the outer periphery of the thick case body 102, a sufficiently large length is guaranteed making it possible to prevent contaminating substances and water from infiltrating into the closed case 101 through the pressure-introducing hole 127. Or, the contaminating substances that have infiltrated adhere on the inner wall surfaces of the covering member 103 opposed to the opening of the pressure-introducing hole 127 and do not reach the pressure sensor chip 1. Moreover, the long pressure-introducing hole 127 prevents the external light from directly entering into the closed case 101. Even if falling into the case 101, the light is once reflected by the inner wall surfaces of the covering member 103 and is weakened. Therefore, the sensor function is not lost even when the light arrives at the sensor chip 1.

The surface of the pressure sensor chip 1 is covered with a silicon gel 128. Moreover, the ends of the terminal plates 125 extend to the external side of the case body 102 and form external terminals (input/output terminals) 129.

Described below is the method of fabricating the thus constituted integrated pressure sensor 100.

Figure 38:
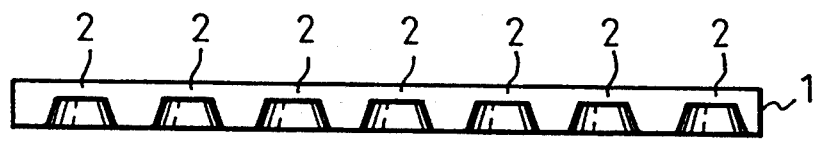
FIGS. 38 to 42 are diagrams illustrating the steps for fabricating the integrated pressure sensor according to the seventh embodiment.
Figure 39:
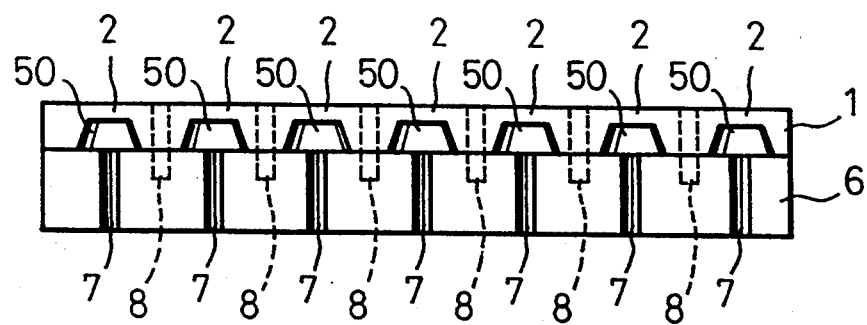

First, the silicon wafer 1 is prepared as shown in FIG. 38. In the silicon wafer 1 are formed, as shown in FIG. 35, a signal processing circuit 5 having an adjusting resistor 4 for each of the chips, a thin diaphragm 2 for each of the chips, and piezo-resistance layer 3 for each of the chips. As shown in FIG. 39, furthermore, the glass seat 6 is prepared having the pressure-adjusting passage 7 for each of the chips, and the silicon wafer 1 is anodically joined onto the glass seat 6. Due to this junction, the opening of the recessed portion of the diaphragm 2 is closed in each pressure sensor thereby to form the pressure reference chamber 50 which is communicated with the pressure-adjusting passage 7 of the seat 6. Thus, the pressure reference portion is constituted by the diaphragm 2 and the pressure-adjusting passage 7.

Figure 40:
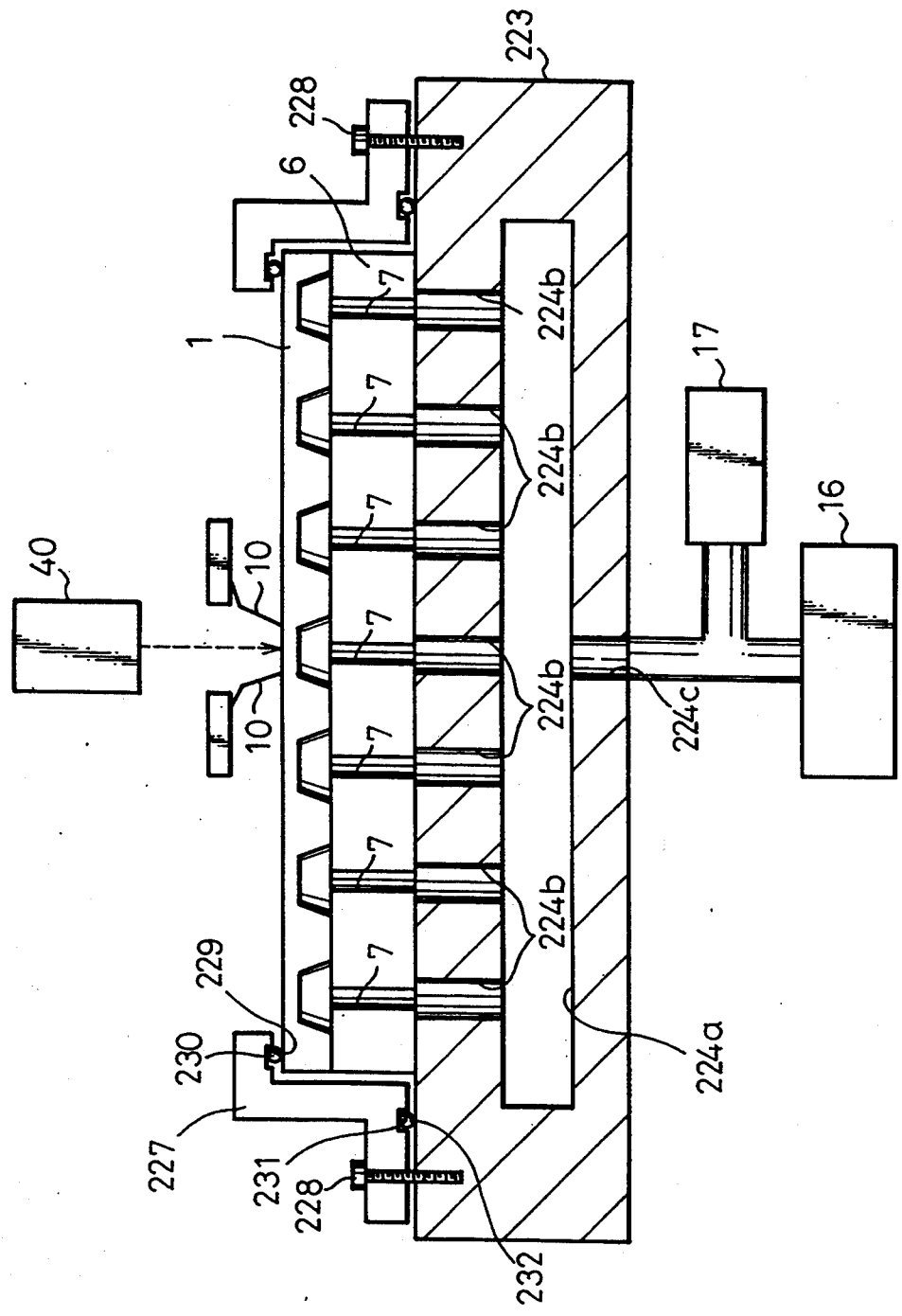

Therefore, the output adjusting device shown in FIG. 40 is made ready. That is, pressure-adjusting passages 224a, 224b and 224c for the stage are formed in the pressure-setting stage 223. One end of the pressure-adjusting passage 224c for the stage is opened in the lower surface, the other end thereof is communicated with the passage 224a which is branched into many passages 224b. The other ends of the pressure-adjusting passages 224b for the stage are opened on the upper surface of the pressure-setting stage 223, the openings being opposed to the openings at the ends of the pressure-adjusting passages 7 for the seat. The pressure-adjusting passage 224c for the stage is connected to the vacuum pump 18 and to the pressure gauge 17. On the pressure-setting stage 223 is placed the glass seat 6 to which the silicon wafer 1 is joined.

A holding member 227 is secured by screws 228 onto the upper surface of the pressure-setting stage 223. The holding member 227 has such a shape as to surround the glass seat 6, outer periphery of the silicon wafer 1 and outer periphery of the upper surface of the silicone wafer 1.

An annular recessed portion 229 is formed in the holding member 227 at a portion opposed to the upper surface of the silicon wafer 1, and an O-ring 230 is disposed in the recessed portion 229 and is compressed by the holding member 227 and the silicon wafer 1. Furthermore, an annular recessed portion 231 is formed in the holding member 227 at a portion opposed to the pressure setting stage 223, and an O-ring 232 is disposed in the recessed portion 231 and is compressed by the pressure setting stage 223 and the holding member 227.

In order to adjust the pressure sensitivity for each of the chips, the glass seat 6 to which the silicon wafer 1 is joined is placed on the pressure setting stage 223 under the condition where the holding member 227 is removed from the pressure setting stage 223. Then, the holding member 227 is placed from the upper side of the silicon wafer 1 and is fastened to the pressure setting stage 223 by screws 228. In this case, the air-tightness is maintained between the holding member 227 and the upper surface of the silicon wafer 1 by the O-ring 230, and the air-tightness is maintained between the holding member 227 and the upper surface of the pressure setting stage 223 by the O-ring 232.

The resistance is adjusted by irradiating the adjusting resistor 4 with a laser beam from the laser device 40 while bringing the prober (needle) 10 in contact with the probing pad 11 (shown in FIG. 35). This adjustment is carried out by applying the atmospheric pressure (760 mmHg) and a negative pressure (2 mmHg) to the diaphragm 2 using the vacuum pump 16 and the pressure gauge 17.

Figure 41:
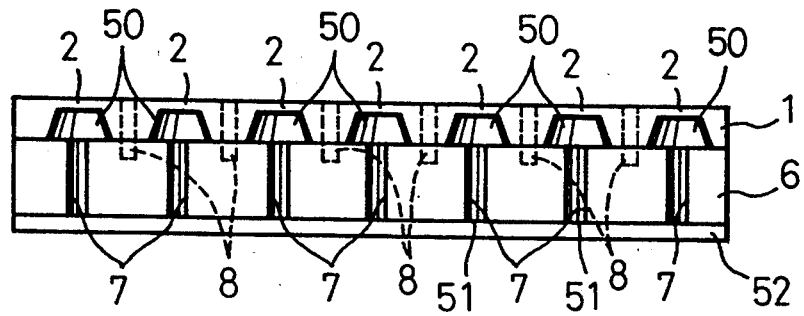

After the pressure sensitivity is adjusted as described above, the silicon wafer 52 which is the sealing member is anodically joined to the back surface of the glass seat 6 under a specified pressure as shown in FIG. 41 in order to seal as designated at 51 the ends on one side of the pressure-adjusting passages 7 for the seat. As a result, the pressure reference chambers 50 are sealed under the reference pressure condition.

Figure 42:
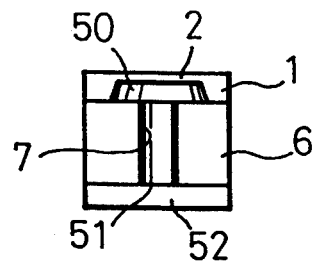

Then as shown in FIG. 42, the silicon wafer 1, glass seat 6 and silicon wafer 52 are cut by dicing for each of the chips. Thus, the integrated pressure sensor 100 shown in FIG. 35 is fabricated.

According to the seventh embodiment as described above, in the silicon wafer 1 are formed the signal processing circuit 5 having the adjusting resistor 4 for each of the chips, the thin diaphragm 2 for each of the chips and the piezo-resistance layer 3 for each of the chips (first step), the silicon wafer 1 is joined onto the glass seat 6 having the pressure-adjusting passage 7 for the seat for each of the chips and the pressure-adjusting passage 7 for the seat is communicated with the pressure reference chamber 50 that is formed between the glass seat 6 and the silicon wafer 1 (second step), the adjusting resistor 4 is trimmed for each of the chips in the silicon wafer 1 while applying a pressure to the diaphragm 2 through the pressure-adjusting passage 7 of the glass substrate 6 (third step), the silicon wafer 52 which is the sealing member is joined to the glass seat 6 to seal as designated at 51 the ends on one side of the pressure-adjusting passages 7 for the seat (forth step), and the silicon wafer 1, glass seat 6 and silicon wafer 52 are cut for each of the chips (fifth step).

As a result as shown in FIG. 35, there is obtained an integrated pressure sensor comprising a pressure sensor chip in which are formed the signal processing circuit 5 with the adjusting resistor 4, the thin diaphragm 2 and the piezo-resistance layer 3; a glass seat 6 which is joined to the pressure sensor chip 1 and has the pressure-adjusting passage 7 for the seat communicated with the pressure reference chamber 50 that is formed between the glass seat 6 and the sensor chip 1; and the silicon chip 52 that is joined to the glass seat 6 and seals one end of the pressure-adjusting passage 7 for the seat after the adjusting resistor 4 has been trimmed by applying the pressure through the pressure-adjusting passage 7 for the seat.

In the integrated pressure sensor, the pressure sensor chip 1 and the glass seat 6 are joined together, and the pressure reference chamber 50 formed between the pressure sensor chip 1 and the glass seat 6 is communicated with the pressure-adjusting passage 7 penetrating through the seat. Under this condition, the silicon chip 52 is joined to the glass seat 6. Here, one end of the pressure-adjusting passage 7 for the seat is sealed as designated at 51 after the adjusting resistor 4 is trimmed by applying the pressure through the pressure-adjusting passage 7 for the seat. In the case shown in FIG. 34, therefore, it was not allowed to apply the pressure to the pressure reference chamber at the time of adjusting the pressure sensitivity, and the pressure had to be applied to the surface on which there is formed the signal processing circuit. Accordingly, the laser device, the probe and the like has to be arranged inside the chamber. According to this embodiment in which the pressure is applied to the pressure reference chamber 50, however, it is allowed to easily adjust the pressure sensitivity. In this embodiment, the half-dicing method, as indicated, in example 1 and in FIGS. 3 and 4, can be used whereby cutting grooves 8, having a predetermined depth of the glass seat 6 past the silicon wafer 1, are provided among of the chips, prior to the trimming operation thereof.

Eighth Embodiment.

Described below are points that make an eighth embodiment different from the seventh embodiments.

The seventh embodiment employs the silicon chip 52 as the sealing member. The eighth embodiment, on the other hand, uses a base member having a thin metal film formed on one surface thereof.

The method of fabrication will now be described.

Figure 43:
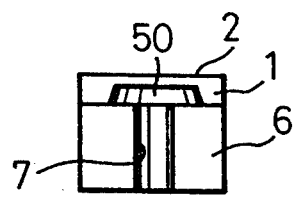
FIG. 43 is a diagram illustrating a step for fabricating the integrated pressure sensor according to the eighth embodiment.
Figure 44:
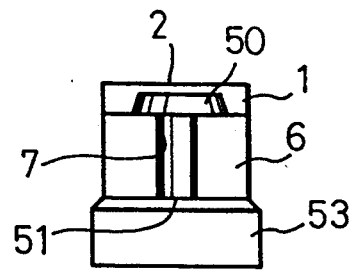
FIG. 44 is a diagram illustrating a step for fabricating the integrated pressure sensor according to the eighth embodiment.

A metal film is formed by vapor deposition on the lower surface of the glass seat 6 to which the silicon wafer 1 is joined as shown in FIG. 39. Then, the pressure sensitivity is adjusted as shown in FIG. 40. Thereafter, as shown in FIG. 43, the silicon wafer 1 and the glass seat 6 are cut by dicing for each of the chips. As shown in FIG. 44, furthermore, there is prepared the base member 53 having a thin metal film formed on one surface thereof. The thin metal film is formed by vapor deposition or sputtering. By using the base member 53, the glass seat 6 is soldered onto the thin metal film of the base member 53 under the specified pressure in order to seal as designated at 51 the lower end of the pressure-adjusting passage 7 for the seat.

The base member 53 may be either a metal plate or a thick circuit in which an electrically conducting paste is sintered on the soldered portions provided it can be joined to the glass seat by the soldering.

According to the eighth embodiment as described above, in the silicon wafer 1 are formed the signal processing circuit 5 having resistor 4 for adjustment for each of the chips, the thin diaphragm 2 for each of the chips and the piezo-resistance layer 3 for each of the chips (first step), the silicon wafer 1 is joined onto the glass seat 6 which has the pressure-adjusting pasage 7 for the seat for each of the chips, and the pressure-adjusting passage 7 for the seat is communicated with the pressure reference chamber 50 that is formed between the glass seat 6 and the silicon wafer 1 (second step), the adjusting resistor 4 is trimmed for each of the chips in the silicon wafer 1 while applying a pressure to the diaphragm 2 through the pressure-adjusting passage 7 of the glass substrate 6 (third step), the silicon wafer 1 and the glass seat 6 are cut for each of the chips (fourth step), and the base member 53 which is the sealing member is joined to the glass seat 6 to seal as designated at 51 the ends on one side of the pressure-adjusting passage 7 for the seat (fifth step). As a result, there is fabricated the integrated pressure sensor which is the same as that of the seventh embodiment. In this embodiment, the half-dicing method, as indicated in example 1, and in FIGS. 3 and 4, can be used whereby cutting grooves 8, having a predetermined depth of the glass seat 6 past the silicon wafer, are formed among the chips, prior to the trimming operation thereof.

In the integrated pressure sensor according to the seventh and eighth embodiments of the present invention, the pressure sensor chip and the seat are joined together, and the pressure reference chamber formed between the seat and the pressure sensor chip is communicated with the pressure-adjusting passage for the seat. Under this condition, the sealing member is joined to the seat. Here, after the adjusting resistor is trimmed by applying the pressure through the pressure-adjusting passage for the seat, one end of the pressure-adjusting passage for the seat is sealed. That is, in the case of FIG. 35, it was not allowed to applying the pressure to the pressure reference chamber at the time of adjusting the output, and the pressure had to be applied to the surface on which there is formed the signal processing circuit. Accordingly, the laser device, the probe and the like had to be arranged inside the chamber. According to this embodiment in which the pressure is applied to the pressure reference chamber, however, it is allowed to easily adjust the output.

In the method of fabricating the pressure sensor according to the seventh embodiment of the present invention, there are formed in the silicon wafer the signal processing circuit having the adjusting resistor for each of the chips, the thin diaphragm for each of the chips and the piezo-resistance layer for each of the chips through the first step, and the silicon wafer is joined onto the seat which has the pressure-adjusting passage for the seat for each of the chips, and the pressure reference chamber formed between the seat and the silicon wafer is communicated with the pressure-adjusting passage for the seat through the second step. Then, the adjusting resistor is trimmed for each of the chips in the silicon wafer by applying the pressure to the diaphragm through the pressure-adjusting passage of the seat through the third step, and the sealing member is joined to the seat to seal one end of the pressure-adjusting passage for the seat through the fourth step. Then, the silicon wafer and the seat are cut for each of the chips through the fifth step. As a result, the aforementioned pressure sensor is fabricated.

According to the eighth embodiment, there are formed in the silicon wafter the signal processing circuit having the adjusting resistor for each of the chips, the thin diagram for each of the chips and the piezo-resistance layer for each of the chips through the first step, and the silicon wafer is joined onto the seat which has the pressure-adjusting passage for the step for each of the chips, and the pressure reference chamber formed between the seat and the silicon wafer is communicated with the pressure-adjusting passage for the seat. Then, the adjusting resistor is trimmed for each of the chips in the silicon wafer by applying the pressure to the diaphragm via the pressure-adjusting passage of the seat through the third step, and the silicon wafer and the chip are cut for each of the chips through the fourth step. Then, the sealing member is joined to the seat to seal the ends on one side of the pressure-adjusting passages for the seat through the fifth step. As a result, the aforementioned pressure sensor is fabricated.

In the method of fabricating the pressure sensor according to the seventh and eighth embodiments of the present invention described above, the half-dicing is executed in advance as described in the first embodiment, and technology is further employed to finally dice the chips.

Concretely speaking, the wafer 1 and the seat 6 are joined as shown in FIG. 39, and then the half-dicing is effected up to a predetermined depth of the glass seat 6 past the silicon wafer 1 for each of the chips thereby to form the cutting grooves as shown in FIG. 3 prior to effecting the trimming quite in the same manner as described with reference to the related portions.

By using the processing of half-dicing in combination, this embodiment, too, makes it possible to accomplish the effects which are obtained by the first embodiment.

We claim:

1. A method of fabricating an integrated pressure sensor comprising:
   a first step for forming on a silicon wafer a thin diphragm for multiple chips, a piezo-resistance layer for each of the chips, and a signal processing circuit that has an adjusting resistor for each of the chips;
   a second step for joining said silicon wafer onto a seat;
   a third step for effecting half-dicing to form a groove having a depth greater than a thickness of said silicon wafer, thereby said half-dicing reaching said seat for each of the chips;
   a fourth step for adjusting the resistance of said adjusting resistor for each of the chips; and
   a fifth step for effecting full-dicing to cut said silicon wafer and said seat for each of the chips.

2. A method of fabricating an integrated pressure sensor according to claim 1, wherein the seat in said second step has pressure-adjusting passages for applying a pressure to the diaphragms of the silicon wafer, and the resistance of said adjusting resistor is adjusted in said fourth step for each of the chips by adjusting the pressure applied to said diphragms via said pressure-adjusting passages.

3. A method of fabricating an integrated pressure sensor according to claim 1, wherein a blade (SAW) used in said step of dicing has a thickness which is smaller than a thickness of a blade (SAW) used in said step of half-dicing.

4. A method of fabricating an integrated pressure sensor according to claim 1, wherein the operation of adjusting the resistance of said adjusting resistor is one of the operations selected from the operation for adjusting the pressure sensitivity of the pressure sensor and the operation for adjusting the offset of output of the pressure sensor.

5. A method of fabricating an integrated pressure sensor comprising:
   a first step for forming on a silicon wafer a signal processing circuit that has an adjusting resistor for each of the chips, a thin diaphragm for each of the chips and a piezo-resistance layer for each of the chips;
   a second step for joining said silicon wafer onto a seat having a pressure-adjusting passage for each of the chips, so that a diaphragm of the silicon wafer is communicated with the pressure-adjusting passage of said seat;
   a third step for trimming the adjusting resistor for each of the chips in the silicon wafer;
   a fourth step for joining a sealing member to one end of the pressure-adjusting passage of said seat; and
   a fifth step for cutting said silicon wafer and said seat for each of the chips.

6. A method of fabricating an integrated pressure sensor comprising:
   a first step for forming on a silicon wafer a signal processing circuit that has an adjusting resistor for each of the chips, a thin diaphragm for each of the chips and a piezo-resistance layer for each of the chips;
   a second step for joining said silicon wafer onto a seat having a pressure-adjusting passage for the seat for each of the chips, so that a diaphragm of the silicon wafer is communicated with the pressure-adjusting passage of said seat;
   a third step for trimming the adjusting resistor for each of the chips in the silicon wafer;
   a fourth step for cutting said silicon wafer and said seat for each of the chips; and
   a fifth step for joining a sealing member to one end of the pressure-adjusting passage of said seat.

7. A method of fabricating an integrated pressure sensor, said method comprising the steps of:
   a first step of forming, on a silicon wafer, a signal processing circuit that has an adjusting resistor for each of a plurality of chips on the wafer, a thin diaphragm for each of the chips, and a piezo-resistance layer for each of the chips;
   a second step of joining said silicon wafer to a seat having a pressure-adjusting passage for each of the chips, so that the diaphrgm of each silicon wafer is communicated with the pressure-adjusting passage of said seat;
   a third step of half-dicing the wafer to form a groove having a depth greater than a thickness of said silicon wafer so that said half-dicing step reaches said seat for each of the chips;
   a fourth step of trimming the adjusting resistor for each of the chips on the silicon wafer;
   a fifth step of joining a sealing member to one end of the pressure-adjusting passage of said seat; and
   a sixth step of full-dicing said wafer and seat to cut said silicon wafer and said seat for each of the chips.

8. A method of fabricating an integrated pressure sensor according to claim 7, wherein said trimming step comprises a step of applying a reference pressure to said diphragm through said pressure-adjusting passage provided in said seat.

9. A method of fabricating an integrated circuit pressure sensor, said method comprising the steps of:
   a first step of forming, on a silicon wafer, a signal processing circuit that has an adjusting resistor for each of a plurality of chips on the wafer, a thin diaphragm for each of the chips and a piezo-resistance layer for each of the chips;
   a second step of joining said silicon wafer to a seat having a pressure-adjusting passage for the seat of each of the chips, so that a diaphragm of the silicon wafer is communicated with the pressure-adjusting passage of said seat;
   a third step of half-dicing said wafer to form a groove having a depth greater than a thickness of said silicon wafer so that said half-dicing step reaches said seat for each of the chips;
   a fourth step of full-dicing said wafer and seat to cut said silicon wafer and said seat for each of the chips;
   a fifth step of trimming the adjusting resistor for each of the chips in the silicon wafer; and
   a sixth step of joining a sealing member to one end of the pressure-adjusting passage of said seat.

10. A method of fabricating a integrated pressure sensor according to claim 9, wherein said trimming operation is carried out by applying a reference pressure to said diaphragm through said pressure-adjusting passage provided in said seat.

* * * * *